United States Patent
Padmanabhan et al.

(10) Patent No.: US 9,653,387 B2
(45) Date of Patent: May 16, 2017

(54) SEMICONDUCTOR COMPONENT AND METHOD OF MANUFACTURE

(71) Applicant: Semiconductor Components Industries, LLC, Phoenix, AZ (US)

(72) Inventors: Balaji Padmanabhan, Tempe, AZ (US); Prasad Venkatraman, Gilbert, AZ (US); Ali Salih, Mesa, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/204,197

(22) Filed: Jul. 7, 2016

(65) Prior Publication Data

US 2017/0025333 A1  Jan. 26, 2017

Related U.S. Application Data

(60) Provisional application No. 62/196,648, filed on Jul. 24, 2015.

(51) Int. Cl.
*H01L 23/495* (2006.01)
*H01L 21/48* (2006.01)

(52) U.S. Cl.
CPC .... *H01L 23/49562* (2013.01); *H01L 21/4825* (2013.01); *H01L 23/4952* (2013.01); *H01L 23/49513* (2013.01); *H01L 23/49524* (2013.01); *H01L 23/49558* (2013.01); *H01L 23/49575* (2013.01); *H01L 23/49517* (2013.01); *H01L 2224/0603* (2013.01); *H01L 2224/16245* (2013.01); *H01L 2224/40245* (2013.01); *H01L 2224/48091* (2013.01); *H01L 2224/48137* (2013.01); *H01L 2224/48257* (2013.01); *H01L 2224/49111* (2013.01); *H01L 2224/49175* (2013.01); *H01L 2224/73221* (2013.01)

(58) Field of Classification Search
CPC .......... H01L 23/49562; H01L 23/4952; H01L 21/4825; H01L 23/49575; H01L 23/49513
See application file for complete search history.

(56) References Cited

U.S. PATENT DOCUMENTS

| | | |
|---|---|---|
| 7,745,913 B2 | 6/2010 | Hosseini et al. |
| 8,455,987 B1 | 6/2013 | Spann et al. |
| 2007/0249092 A1 | 10/2007 | Joshi et al. |

(Continued)

*Primary Examiner* — Victor A Mandala
(74) *Attorney, Agent, or Firm* — Rennie William Dover

(57) ABSTRACT

In accordance with an embodiment, a semiconductor component includes a support having a first device receiving structure, a second device receiving structure, a first lead, a second lead, and a third lead. A first semiconductor chip is coupled to the first device receiving structure and a second semiconductor chip is coupled to the first semiconductor chip and the second device receiving structure. The first semiconductor chip is configured from a silicon semiconductor material and has a gate bond pad, a source bond pad, and a drain bond pad, and the second semiconductor chip is configured from a gallium nitride semiconductor chip and has a gate bond pad, a source bond pad, and a drain bond pad. In accordance with another embodiment, a method for manufacturing a semiconductor component includes coupling a first semiconductor chip to a support and coupling a second semiconductor chip to the support.

20 Claims, 17 Drawing Sheets

(56) References Cited

U.S. PATENT DOCUMENTS

| | | |
|---|---|---|
| 2008/0164590 A1 | 7/2008 | Xiaochun et al. |
| 2010/0232131 A1 | 9/2010 | Qian et al. |
| 2011/0049580 A1* | 3/2011 | Lui .................. H01L 23/49575 |
| | | 257/262 |
| 2011/0133251 A1 | 6/2011 | He |
| 2012/0223321 A1* | 9/2012 | Lin ..................... H01L 25/074 |
| | | 257/76 |
| 2012/0223322 A1 | 9/2012 | Lin et al. |
| 2013/0069208 A1 | 3/2013 | Briere |
| 2013/0088280 A1 | 4/2013 | Lal et al. |
| 2013/0175704 A1 | 7/2013 | Jeun |
| 2013/0256856 A1 | 10/2013 | Mahler et al. |
| 2014/0061673 A1* | 3/2014 | Miyanagi ................ H01L 24/73 |
| | | 257/77 |
| 2014/0103510 A1 | 4/2014 | Andou |
| 2014/0197525 A1 | 7/2014 | Kadoguchi |
| 2014/0239472 A1 | 8/2014 | Jones et al. |
| 2014/0361419 A1 | 12/2014 | Xue et al. |
| 2015/0145112 A1 | 5/2015 | Otremba |
| 2015/0173248 A1* | 6/2015 | Zeng ................... H05K 7/1432 |
| | | 361/709 |
| 2016/0071781 A1* | 3/2016 | Sheridan ............... H01L 23/345 |
| | | 257/705 |
| 2016/0211246 A1 | 7/2016 | Akiyama et al. |
| 2017/0025328 A1* | 1/2017 | Liu ..................... H01L 23/4952 |
| 2017/0025335 A1* | 1/2017 | Liu ................... H01L 23/49575 |
| 2017/0025336 A1* | 1/2017 | Padmanabhan ... H01L 23/49575 |
| 2017/0025337 A1* | 1/2017 | Padmanabhan ... H01L 23/49575 |
| 2017/0025338 A1* | 1/2017 | Padmanabhan ... H01L 23/49575 |
| 2017/0025339 A1* | 1/2017 | Liu ................... H01L 23/49575 |
| 2017/0025340 A1* | 1/2017 | Padmanabhan ... H01L 23/49575 |

* cited by examiner

SEMICONDUCTOR COMPONENT AND METHOD OF MANUFACTURE

The present application is a nonprovisional application of Provisional Patent Application No. 62/196,648 filed on Jul. 24, 2015, by Balaji Padmanabhan et al., titled "SEMICONDUCTOR COMPONENT AND METHOD OF MANUFACTURE", which is hereby incorporated by reference in its entirety, and priority thereto for common subject matter is hereby claimed.

TECHNICAL FIELD

The present invention relates, in general, to electronics and, more particularly, to semiconductor structures thereof, and methods of forming semiconductor devices.

BACKGROUND

In the past, semiconductor manufacturers have used a combination of silicon semiconductor materials and III-N semiconductor materials to manufacture cascoded devices, such as a normally-on III-N depletion mode HEMT cascoded with a silicon device. Using this combination of materials helps achieve a normally-off state using a III-N depletion mode device that is normally-on. In cascoded devices configured as switches, the silicon device often operates in avalanche mode due to high leakage currents of the III-N device that is operating under a high drain bias. In the avalanche operating mode, the gate of the III-N device is under a large stress in which the absolute gate to source voltage exceeds the devices pinch-off voltage. Hard stress conditions such as operating the silicon device in the avalanche mode degrades device reliability, lowers the breakdown voltage, and increases leakage currents. Cascoded semiconductor devices have been described in U.S. Patent Application Publication Number 2013/0088280 A1 by Rakesh K. Lal et al. and published on Apr. 11, 2013.

After manufacturing cascoded devices from different semiconductor substrate materials, semiconductor component manufacturers typically protect the silicon device and the depletion mode devices in separate packages and connect the devices in the separate packages together via leadframe leads to form a cascoded device. A drawback with this approach is that increasing the number of packages increases the cost of a cascoded semiconductor component and degrades the performance of the cascoded devices because of increased parasitics such as parasitic capacitance and parasitic inductance.

Accordingly, it would be advantageous to have a cascoded semiconductor device and a method for manufacturing the cascoded semiconductor device. It would be of further advantage for the structure and method to be cost efficient to implement.

BRIEF DESCRIPTION OF THE DRAWINGS

The present invention will be better understood from a reading of the following detailed description, taken in conjunction with the accompanying drawing figures, in which like reference characters designate like elements and in which.

Figure 1:
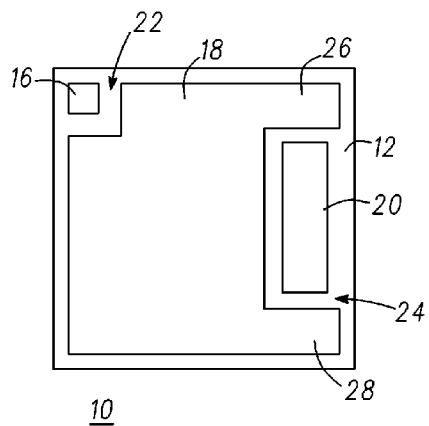
FIG. 1 is a top view of a semiconductor chip suitable for use in manufacturing a cascode configured semiconductor component in accordance with an embodiment of the present invention.

For simplicity and clarity of illustration, elements in the figures are not necessarily to scale, and the same reference characters in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current flow through the device such as a gate of an MOS transistor or a base of a bipolar transistor. Although the devices are explained herein as certain n-channel or p-channel devices, or certain n-type or p-type doped regions, a person of ordinary skill in the art will appreciate that complementary devices are also possible in accordance with embodiments of the present invention. It will be appreciated by those skilled in the art that the words during, while, and when as used herein are not exact terms that mean an action takes place instantly upon an initiating action but that there may be some small but reasonable delay, such as a propagation delay, between the reaction that is initiated by the initial action and the initial action. The use of the words approximately, about, or substantially means that a value of an element has a parameter that is expected to be very close to a stated value or position. However, as is well known in the art there are always minor variances that prevent the values or positions from being exactly as stated. It is well established in the art that variances of up to about ten per cent (10%) (and up to twenty per cent (20%) for semiconductor doping concentrations) are regarded as reasonable variances from the ideal goal of being exactly as described.

DETAILED DESCRIPTION

FIG. 1 is a top view of a semiconductor chip 10 suitable for use in manufacturing a semiconductor component in accordance with an embodiment of the present invention. Semiconductor chip 10 has a top surface 12 and a bottom surface 14 (shown in FIGS. 6 and 7), wherein a gate bond pad 16 is formed on or from a portion of top surface 12, a source bond pad 18 is formed on or from another portion of top surface 12, and a drain bond pad 20 formed on or from another portion of top surface 12. In accordance with an embodiment, semiconductor chip 10 is a rectangular shaped silicon based semiconductor material, wherein the semiconductor material may be referred to as a body of semiconductor material. Gate bond pad 16 is a square shaped electrically conductive structure that is electrically connected to a drain region of a semiconductor device and formed in a corner of the rectangular shaped silicon based semiconductor material. Source bond pad 18 is an electrically conductive material that has a rectangular shape with two opposing sides, wherein a notch 22 is formed in a corner of the source bond pad 18. Gate bond pad 16 is formed in the region of notch 22. On the side of source bond pad 18 opposite the side from which notch 22 has been formed a rectangularly shaped notch 24 is formed, leaving rectangularly shaped extensions 26 and 28. Rectangularly shaped drain bond pad 20 is formed in the region of notch 24, i.e., between extensions 26 and 28.

Figure 2:
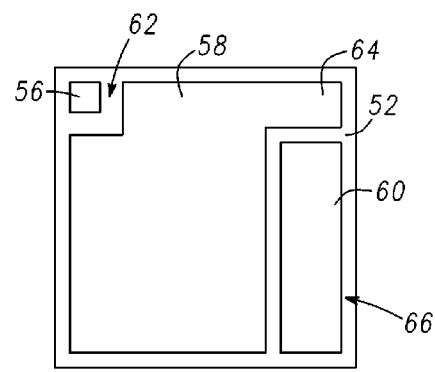
FIG. 2 is a top view of a semiconductor chip suitable for use in manufacturing a cascode configured semiconductor component in accordance with an embodiment of the present invention.

FIG. 2 is a top view of a semiconductor chip 50 suitable for use in manufacturing a semiconductor component in accordance with an embodiment of the present invention. Semiconductor chip 50 has a top surface 52 and a bottom surface 54 (shown in at least FIGS. 20 and 21), wherein a gate bond pad 56 is formed on or from a portion of top surface 52, a source bond pad 58 is formed on or from another portion of top surface 52, and a drain bond pad 60 is formed on or from another portion of top surface 52. In accordance with an embodiment, semiconductor chip 50 is a rectangular shaped silicon based semiconductor material, wherein the semiconductor material may be referred to as a body of semiconductor material. Gate bond pad 56 is a square shaped electrically conductive structure that is formed in a corner of the rectangular shaped silicon based semiconductor material. Source bond pad 58 is an electrically conductive material that has a rectangular shape with two opposing sides, wherein a notch 62 is formed in a side of the source bond pad 58 and an extension 64 extends from a side of source bond pad 58 that is opposite the side of source bond pad 58 from which gate bond pad 56 is formed. Gate bond pad 56 is formed in the region of notch 62. A notch 66 is formed in the side of source bond pad 58 that is opposite the side from which notch 62 is formed. Extension 64 remains after notch 66 is formed. Rectangularly shaped drain bond pad 60 is formed in notch 66.

Figure 3:
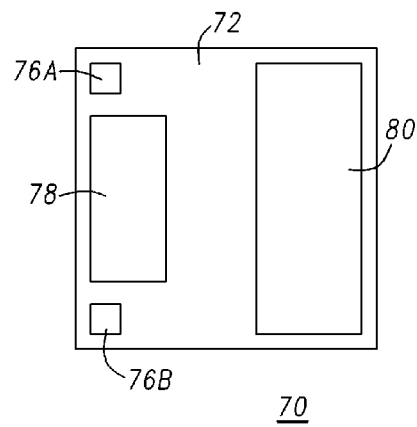
FIG. 3 is a top view of a semiconductor chip suitable for use in manufacturing a cascode configured semiconductor component in accordance with an embodiment of the present invention.

FIG. 3 is a top view of a semiconductor chip 70 suitable for use in manufacturing a semiconductor component in accordance with an embodiment of the present invention. Semiconductor chip 70 has a top surface 72 and a bottom surface 74 (shown in at least FIGS. 6 and 7), wherein gate bond pads 76A and 76B are formed on or from a portion of top surface 72, a source bond pad 78 is formed on or from another portion of top surface 72, and a drain bond pad 80 is formed on or from another portion of top surface 72. In accordance with an embodiment, semiconductor chip 70 is fabricated from a compound semiconductor material such as, for example, a III-nitride semiconductor material. Thus, semiconductor chip 70 may be referred to as a III-nitride semiconductor chip, i.e., the substrate material of III-nitride semiconductor chip 70 comprises a III-nitride material such as, for example, gallium nitride. A III-nitride semiconductor material may be referred to as a III-N semiconductor material, a III-nitride based semiconductor material, a III-N based semiconductor material, or the like. This material may be referred to as a body of semiconductor material. A semiconductor chip such as, for example, semiconductor chip 70, may be referred to as a semiconductor die.

Figure 4:
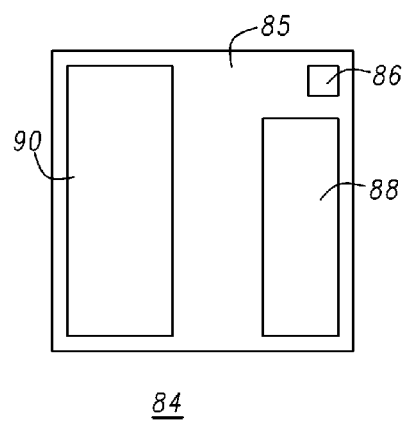
FIG. 4 is a top view of a semiconductor chip suitable for use in manufacturing a cascode configured semiconductor component in accordance with an embodiment of the present invention.

FIG. 4 is a top view of a semiconductor chip 84 suitable for use in manufacturing a semiconductor component in accordance with an embodiment of the present invention. Semiconductor chip 84 has a top surface 85 and a bottom surface 87 (shown in at least FIGS. 20 and 21), wherein a gate bond pad 86 is formed on or from a portion of top surface 85, a source bond pad 88 is formed on or from another portion of top surface 85, and a drain bond pad 90 formed on or from another portion of top surface 85. In accordance with an embodiment, semiconductor chip 84 is fabricated from a compound semiconductor material such as, for example, a III-nitride semiconductor material. Thus, semiconductor chip 84 may be referred to as a III-nitride semiconductor chip, i.e., the substrate material of III-nitride semiconductor chip 84 comprises a III-nitride material such as, for example, gallium nitride. A III-nitride semiconductor material may be referred to as a III-N semiconductor material, a III-nitride based semiconductor material, a III-N based semiconductor material, or the like. This material may be referred to as a body of semiconductor material. A semiconductor chip such as, for example, semiconductor chip 84, may be referred to as a semiconductor die.

Figure 5:
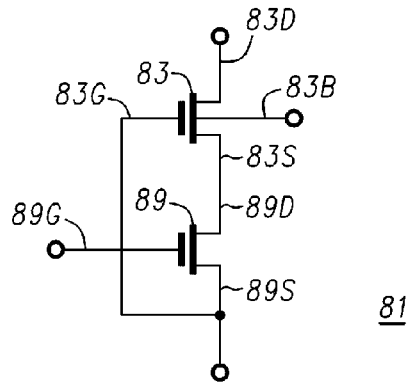
FIG. 5 is a circuit schematic of a cascode configure semiconductor component.

FIG. 5 is a circuit schematic 81 of a semiconductor component in a cascode configuration. The semiconductor component includes transistors 89 and 83, where transistor 89 has a gate electrode 89G, a source electrode 89S, and a drain electrode 89D and transistor 83 has a gate electrode 83G, a source electrode 83S, a drain electrode 83D, and a body/substrate terminal 83B. Drain electrode 89D is electrically connected to source electrode 83S and source electrode 89S is electrically connected to gate electrode 83G. Drain electrode 83D may be coupled for receiving a first source of operating potential such as, for example, a potential $V_{DD}$, for the cascoded semiconductor component of circuit schematic 81, gate electrode 89G serves as an input terminal for the cascoded semiconductor component of circuit schematic 81, and source electrode 89S is coupled for receiving a second source of operating potential such as, for example potential $V_{SS}$. By way of example, potential $V_{SS}$ is ground. It should be noted that the substrate of III-N transistor 83 is floating, thus semiconductor component 81 may be referred to as being in a floating configuration or substrate floating configuration.

Figure 6:
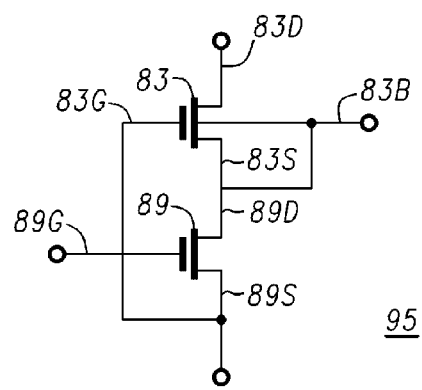
FIG. 6 is a circuit schematic of a cascode configure semiconductor component.

FIG. 6 is a circuit schematic 95 of a semiconductor component in a cascode configuration. The semiconductor component includes transistors 89 and 83, where transistor 89 has a gate electrode 89G, a source electrode 89S, and a drain electrode 89D and transistor 83 has a gate electrode 83G, a source electrode 83S, a drain electrode 83D, and a body/substrate terminal 83B. Drain electrode 89D is electrically connected to source electrode 83S and source electrode 89S is electrically connected to gate electrode 83G. Drain electrode 83D may be coupled for receiving a first source of operating potential such as, for example, potential $V_{DD}$, for the cascoded semiconductor component of circuit schematic 95, gate electrode 89G serves as an input terminal for the cascoded semiconductor component of circuit schematic 95, and source electrode 89S is coupled for the receiving a second source of operating potential such as, for example, a potential $V_{SS}$. By way of example, potential $V_{SS}$ is a ground potential. Substrate terminal 83B of transistor 83 is electrically connected to source electrode 83S of transistor 83 and to the drain electrode of transistor 83. Thus, the substrate of transistor 83 is coupled to the same potential as source electrode 83S of transistor 83 or drain electrode 89D of transistor 89.

Figure 7:
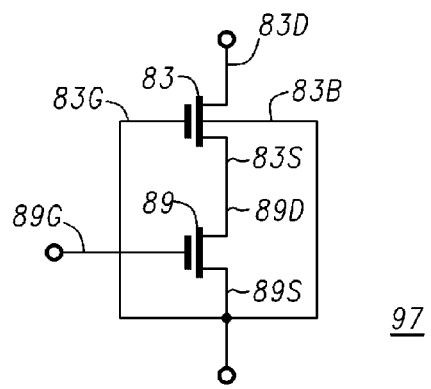
FIG. 7 is a circuit schematic of a cascode configure semiconductor component.

FIG. 7 is a circuit schematic 97 of a semiconductor component in a cascode configuration. The semiconductor component includes transistors 89 and 83, where transistor 89 has a gate electrode 89G, a source electrode 89S, and a drain electrode 89D and transistor 83 has a gate electrode 83G, a source electrode 83S, a drain electrode 83D, and a body/substrate terminal 83B. Drain electrode 89D of transistor 89 is electrically connected to source electrode 83S of transistor 83 and source electrode 89S of transistor 89 is electrically connected to gate electrode 83G of transistor 83. Drain electrode 83D may be coupled for receiving a first source of operating potential such as, for example potential $V_{DD}$, for the cascoded semiconductor component of circuit schematic 97, gate electrode 89G serves as an input terminal for the cascoded semiconductor component of circuit schematic 97, and source electrode 89S is coupled for receiving a second source of operating potential such as for example potential $V_{SS}$. By way of example potential $V_{SS}$ is a ground potential. Substrate terminal 83B of transistor 83 is electrically connected to source electrode 89S of transistor 89. Thus, the substrate of transistor 83 is coupled to the same potential as source electrode 89S of transistor 89.

Figure 8:
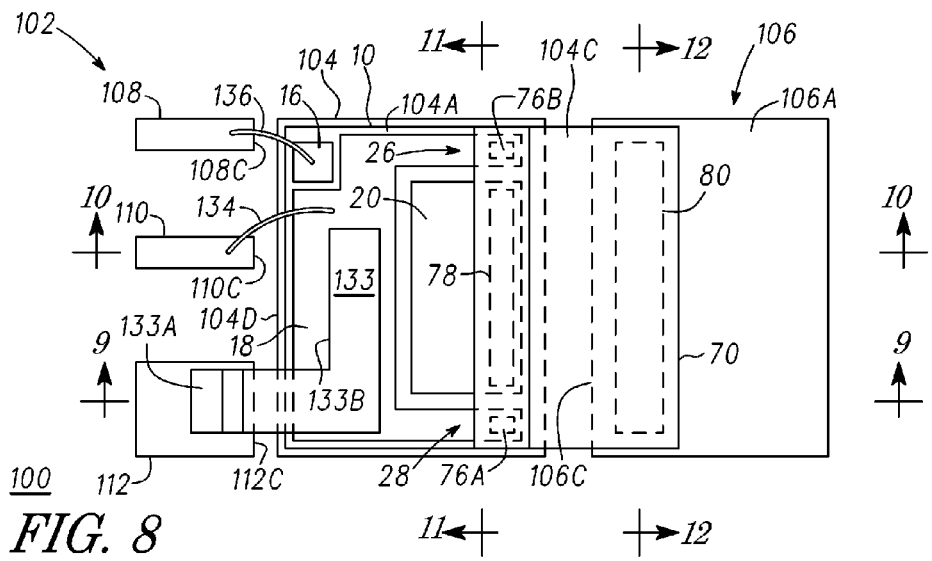
FIG. 8 is a top view of a cascode configured semiconductor component in accordance with an embodiment of the present invention.
Figure 9:
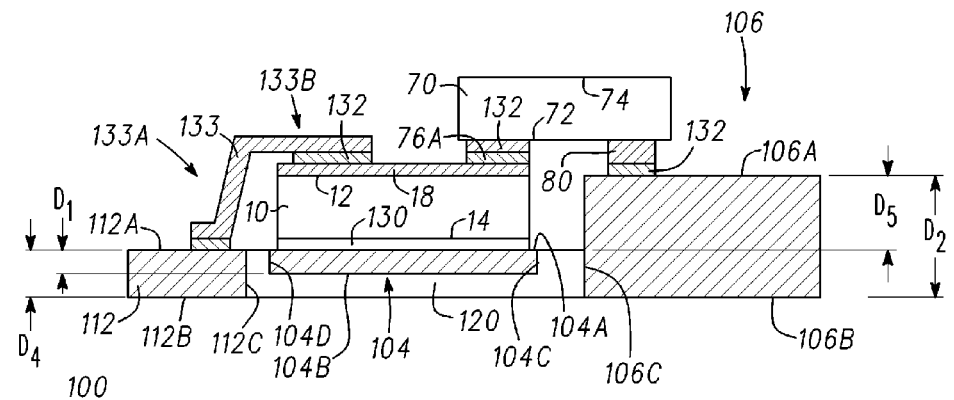
FIG. 9 is a cross-sectional view of the cascode configured semiconductor component of FIG. 8 taken along section line 9-9 of FIG. 8.
Figure 10:
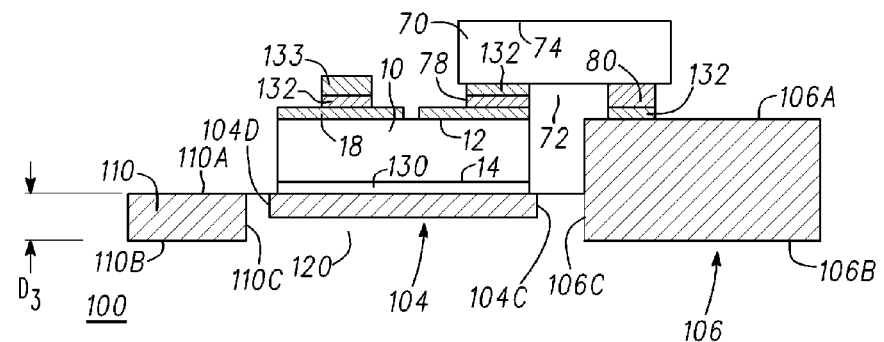
FIG. 10 is a cross-sectional view of the cascode configured semiconductor component of FIG. 8 taken along section line 10-10 of FIG. 8.
Figure 11:
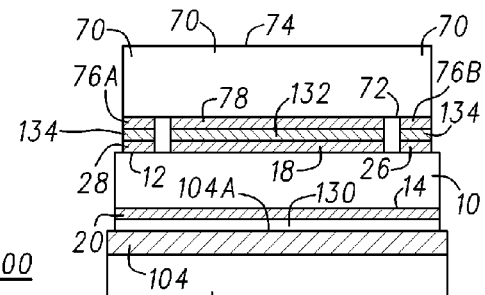
FIG. 11 is a cross-sectional view of the cascode configured semiconductor component of FIG. 8 taken along section line 11-1 of FIG. 8.
Figure 12:
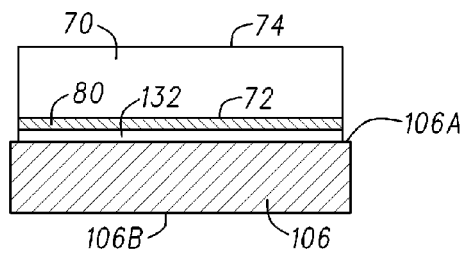
FIG. 12 is a cross-sectional view of the cascode configured semiconductor component of FIG. 8 taken along section line 12-12 of FIG. 8.

FIG. 8 is a top view of a semiconductor component 100 comprising a support 102 to which a semiconductor chip 10 and a semiconductor chip 70 are mounted in accordance with an embodiment of the present invention. FIG. 9 is a cross-sectional view of semiconductor component 100 taken along section line 9-9 of FIG. 8; FIG. 10 is a cross-sectional view of semiconductor component 100 taken along section line 10-10 of FIG. 8; FIG. 11 is a cross-sectional view of semiconductor component 100 taken along section line 11-11 of FIG. 8; and FIG. 12 is a cross-sectional view of semiconductor component 100 taken along section line 12-12 of FIG. 8. For the sake of clarity, FIGS. 8-12 are described together. Support 102 includes a device receiving structure 104, a device receiving structure 106, a gate lead 108, a kelvin lead 110, and a source lead 112 and is configured to be packaged in a QFN package. Device receiving structure 104 is comprised of a square shaped electrically conductive structure having a major surface 104A opposite and spaced apart from a major surface 104B by a distance $D_1$. Device receiving structure 104 has opposing edges 104C and 104D. Device receiving structure 106 is comprised of a rectangularly shaped electrically conductive structure having a major surface 106A opposite and spaced apart from a major surface 106B by a distance $D_2$. Device receiving structure 106 has an edge 106C. By way of example, distance $D_1$ is less than distance $D_2$. Gate lead 108 is comprised of a rectangularly shaped electrically conductive structure having an edge 108C. Kelvin lead 110 is comprised of a rectangularly shaped electrically conductive structure having a major surface 110A opposite and spaced apart from a major surface 110B by a distance $D_3$. Kelvin lead 110 has an edge 110C. Source lead 112 is comprised of a rectangularly shaped electrically conductive structure having a major surface 112A opposite and spaced apart from a major surface 112B by a distance $D_4$. Device receiving structure 112 has an edge 112C. By way of example, distances $D_2$, $D_3$, and $D_4$ are substantially the same; edge 104C faces edge 106C, edge 108C faces edge 104D, edge 110C faces edge 104D, and edge 112C faces edge 104D. Suitable materials for device receiving structure 104, device receiving structure 106, gate lead 108, source lead 110, and drain lead 112 include copper, aluminum, or the like.

Support 102 is configured so that device receiving structure 104 is laterally positioned between device receiving structure 106 and leads 108, 110, and 112 such that edge 104D is adjacent to or faces edge 106C, edge 108C is adjacent to or faces edge 104D, edge 110C is adjacent to or faces edge 104D, and edge 112C is adjacent to or faces edge 104D. Device receiving structure 104 is positioned such that surface 104B and edges 104C and 104D contact a thermally enhanced mold compound 120. In addition edge 106C of device receiving structure 106 and edges 108C, 110C, and 112C of leads 108, 110, and 112, respectively, contact thermally enhanced mold compound 120. Thus, device receiving structure 104 is partially embedded in thermally enhanced mold compound 120. In accordance with an embodiment, device receiving structure 104 is positioned with respect to device receiving structure 106 such that surfaces 104A and 106A are not coplanar but vertically separated by a distance $D_5$.

Semiconductor chip 10 is mounted to or bonded to device receiving structure 104. More particularly, a layer of die attach material 130 is formed on surface 104A of device receiving structure 104 and surface 14 of semiconductor chip 10 is placed in die attach material 130. A bonding agent 132 is formed on source bond pad 18 including rectangularly shaped extensions 26 and 28, drain pad 20, source lead 112, and device receiving structure 106. Suitable materials for bonding agent 132 include solder, an electrically conductive adhesive, an electrically conductive die attach material, or the like. In accordance with an embodiment, distance $D_5$ is set so that surface 12 of silicon chip 20 is substantially coplanar with surface 106A of device receiving structure 106.

Semiconductor chip 70 is bonded to semiconductor chip 10 and device receiving structure 106 in a flip-chip configuration. Thus, gate bond pad 76A of semiconductor chip 70 is bonded to extension 28, gate bond pad 76B of semiconductor chip 70 is bonded to extension 26, and source bond 78 of semiconductor chip 70 is bonded to drain bond pad 20 of semiconductor chip 10.

A clip 133 having terminals 133A and 133B electrically connects source bond pad 18 with source lead 112. Terminal 133A is connected to source lead 112 through bonding agent 132 and terminal 133B is connected to source contact 18 through bonding agent 132. Suitable materials for bonding agent 132 have been described above. Source bond pad 18 is electrically connected to Kelvin lead 110 through a bonding wire 134 and gate bond pad 16 is electrically connected to gate lead 108 through a bonding wire 136. Bonding wires such as bonding wires 134 and 136 may be referred to as wirebonds.

As those skilled in the art are aware, support 102, including surfaces 104A and 106A of device receiving structures 104 and 106, respectively, semiconductor chip 10, semiconductor chip 70, and clip 133 may be encapsulated in a protective material such as, for example a mold compound (not shown). Mold compound 120 may be a portion of the mold compound in which semiconductor chip 10, semiconductor chip 70, and clip 133 may be encapsulated. Semiconductor component 100 shown in FIGS. 8-12 may be represented schematically by circuit schematic 81 shown in FIG. 5, where the substrate of III-N semiconductor chip 70 is floating. For the sake of convenience, semiconductor chip 70 may be referred to as a semiconductor chip.

Figure 13:
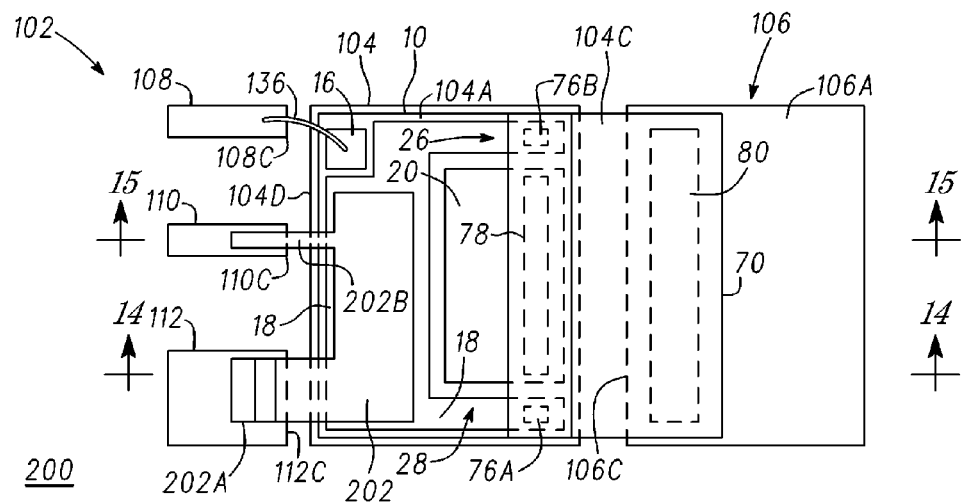
FIG. 13 is a top view of a cascode configured semiconductor component in accordance with another embodiment of the present invention.
Figure 14:
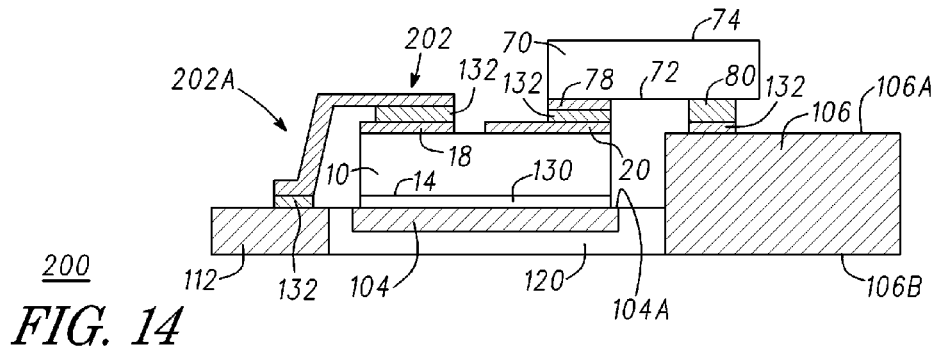
FIG. 14 is a cross-sectional view of the cascode configured semiconductor component of FIG. 13 taken along section line 14-14 of FIG. 13.
Figure 15:
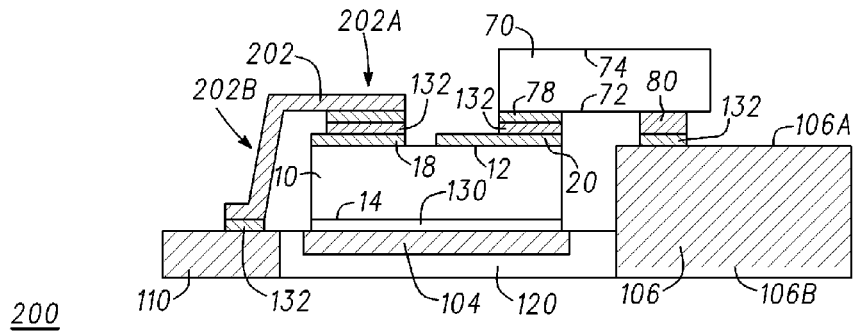
FIG. 15 is a cross-sectional view of the cascode configured semiconductor component of FIG. 13 taken along section line 15-15 of FIG. 13.

FIG. 13 is a top view of a semiconductor component 200 comprising support 102 to which semiconductor chip 10 and a semiconductor chip 70 are mounted in accordance with an embodiment of the present invention. FIG. 14 is a cross-sectional view of semiconductor component 200 taken along section line 14-14 of FIG. 13 and FIG. 15 is a cross-sectional view of semiconductor component 200 taken along section line 15-15 of FIG. 13. For the sake of clarity, FIGS. 13-15 are described together. Support 102 including semiconductor chips 10 and 70 have been described with reference to FIGS. 8-12. As discussed above, support 102 is configured for use in a QFN package. Semiconductor component 200 differs from semiconductor component 100 in that bonding wire 134 and clip 133 are absent from semiconductor component 200 and source bond pad 18 is electrically coupled to Kelvin lead 110 and source lead 112 through an electrically conductive clip 202. More particularly, electrically conductive clip 202 has a terminal 202A and a terminal 202B where terminal 202A is electrically connected to source lead 112 through a bonding agent 132 and terminal 202B is electrically connected to Kelvin lead 110 through bonding agent 132. Semiconductor component 200 shown in FIGS. 13-15 may be represented schematically by circuit schematic 81 shown in FIG. 5, where the substrate of III-N semiconductor chip 70 is floating. For the sake of convenience, semiconductor chip 70 may be referred to as a semiconductor device.

Figure 16:
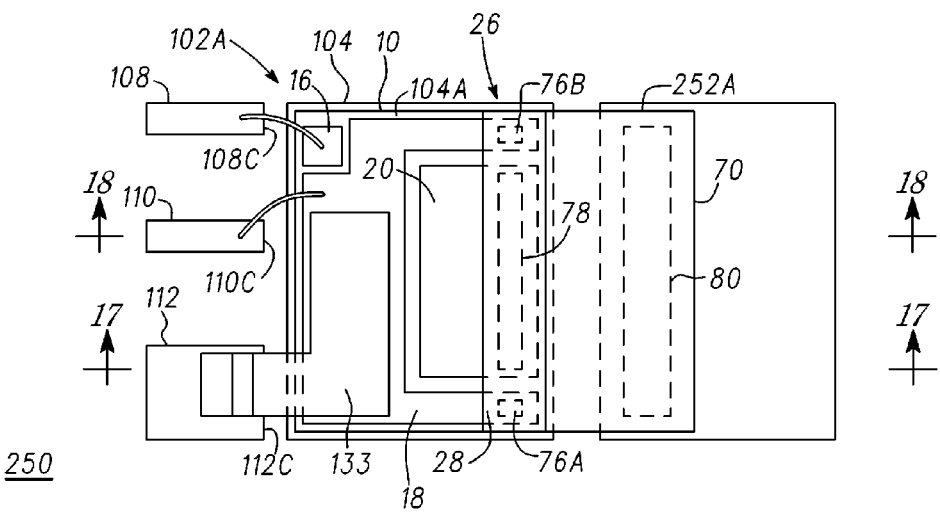
FIG. 16 is a top view of a cascode configured semiconductor component in accordance with another embodiment of the present invention.
Figure 17:
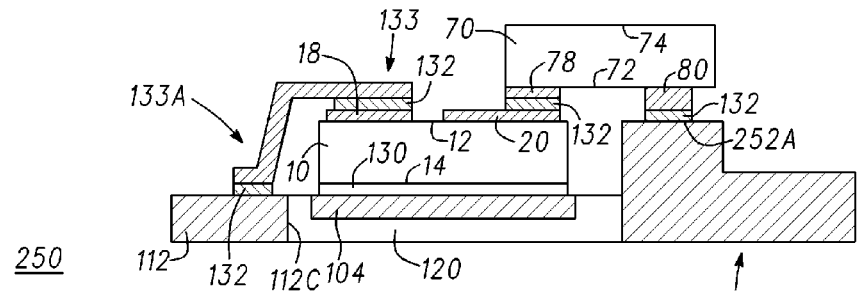
FIG. 17 is a cross-sectional view of the cascode configured semiconductor component of FIG. 16 taken along section line 17-17 of FIG. 16.
Figure 18:
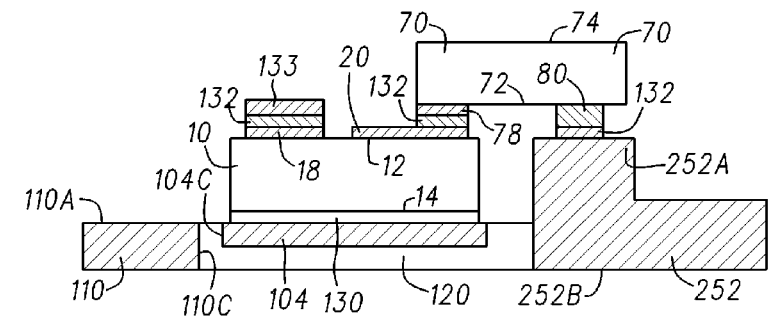
FIG. 18 is a cross-sectional view of the cascode configured semiconductor component of FIG. 16 taken along section line 18-18 of FIG. 16.

FIG. 16 is a top view of a semiconductor component 250 comprising support 102A to which semiconductor chip 10 and a semiconductor chip 70 are mounted in accordance with an embodiment of the present invention. FIG. 17 is a cross-sectional view of semiconductor component 250 taken along section line 17-17 of FIG. 16 and FIG. 18 is a cross-sectional view of semiconductor component 250 taken along section line 18-18 of FIG. 16. For the sake of clarity, FIGS. 16-18 are described together. Support 102A is similar to support 102 except that device receiving structure 106 of support 102 is replaced with a pedestal structure 252 having a surface 252A that corresponds to surface 106A of support 102 and a surface 252B that corresponds to surface 106B of support 102. Thus, semiconductor component 250 shown in FIGS. 16-18 may be represented schematically by circuit schematic 81 shown in FIG. 5, where the substrate of III-N semiconductor chip 70 is floating.

Figure 19:
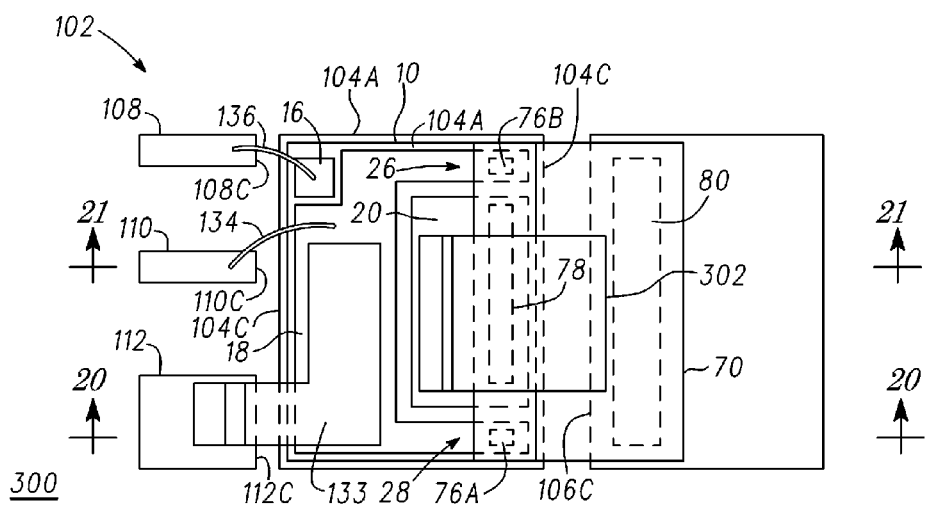
FIG. 19 is a top view of a cascode configured semiconductor component in accordance with another embodiment of the present invention.
Figure 20:
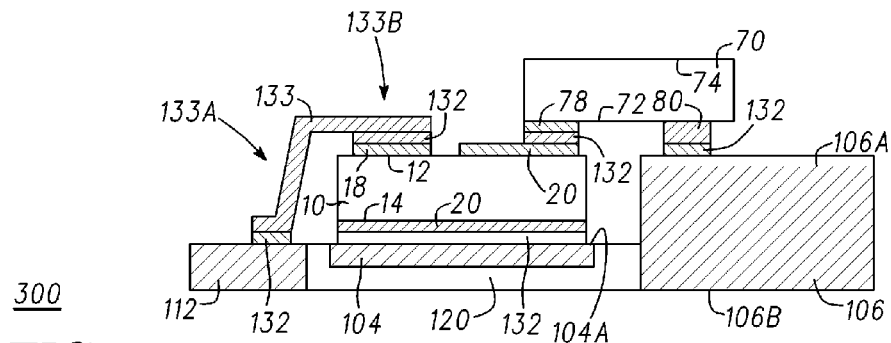
FIG. 20 is a cross-sectional view of the cascode configured semiconductor component of FIG. 19 taken along section line 20-20 of FIG. 19.
Figure 21:
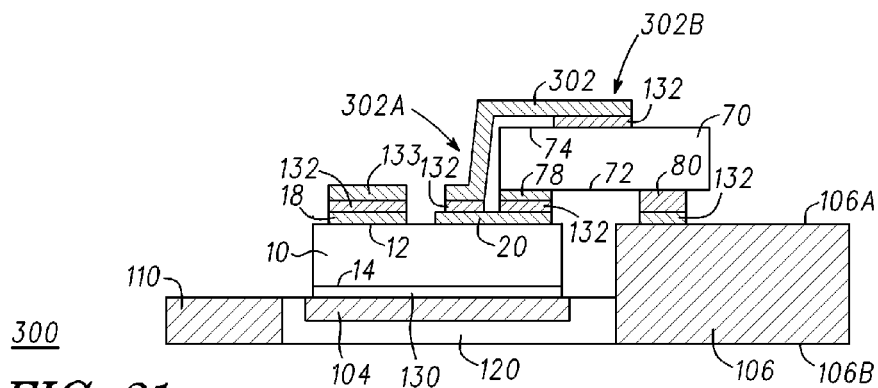
FIG. 21 is a cross-sectional view of the cascode configured semiconductor component of FIG. 19 taken along section line 21-21 of FIG. 19.

FIG. 19 is a top view of a semiconductor component 300 comprising a support 102 to which a semiconductor chip 10 and a semiconductor chip 70 are mounted in accordance with an embodiment of the present invention. FIG. 20 is a cross-sectional view of semiconductor component 300 taken along section line 20-20 of FIG. 19 and FIG. 21 is a cross-sectional view of semiconductor component 300 taken along section line 21-21 of FIG. 19. For the sake of clarity, FIGS. 19-21 are described together. Semiconductor component 300 is similar to semiconductor component 100 described with reference to FIGS. 8-12, except that semiconductor component 300 includes a clip 302 that connects the drain of silicon semiconductor chip 10 to surface 74 of the body/substrate of semiconductor material of semiconductor chip 70. More particularly, clip 302 has terminals 302A and 302B where terminal 302A is connected to drain bond pad 20 through a bonding agent 132 and terminal 302B is bonded to surface 74 of the body of semiconductor material of semiconductor chip 70.

As those skilled in the art are aware, support 102, including surfaces 104A and 106A of device receiving structures 104 and 106, respectively, semiconductor chip 10, semiconductor chip 70, and clips 133 and 302 may be encapsulated in a protection material such as, for example a mold compound. Mold compound 120 may be a portion of the protection material.

Semiconductor component 300 shown in FIGS. 19-21 may be represented schematically by circuit schematic 95 shown in FIG. 6, where the substrate of III-N semiconductor chip 70 is coupled to the drain of semiconductor chip 10 and to the source of semiconductor chip 70.

Figure 22:
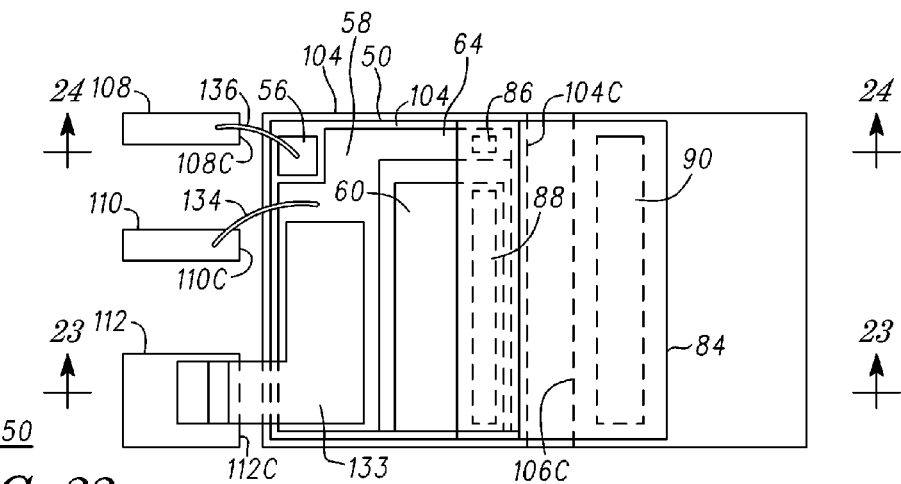
FIG. 22 is a top view of a cascode configured semiconductor component in accordance with another embodiment of the present invention.
Figure 23:
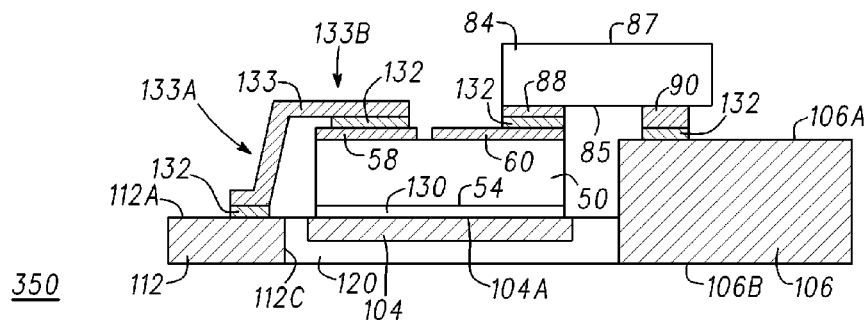
FIG. 23 is a cross-sectional view of the cascode configured semiconductor component of FIG. 22 taken along section line 23-23 of FIG. 22.
Figure 24:
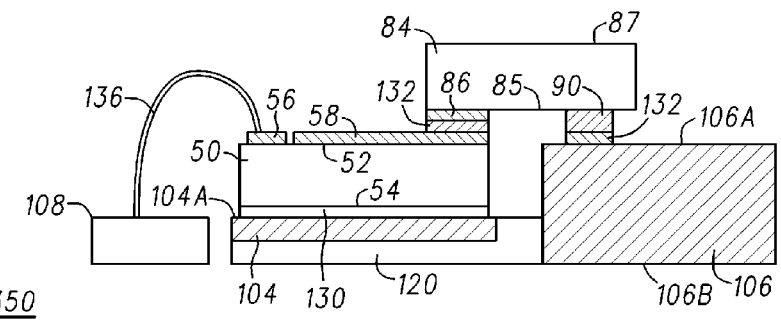
FIG. 24 is a cross-sectional view of the cascode configured semiconductor component of FIG. 22 taken along section line 24-24 of FIG. 22.

FIG. 22 is a top view of a semiconductor component 350 comprising a support 102 to which a semiconductor chip 50 and a semiconductor chip 84 are mounted in accordance with an embodiment of the present invention. FIG. 23 is a cross-sectional view of semiconductor component 350 taken along section line 23-23 of FIG. 22 and FIG. 24 is a cross-sectional view of semiconductor component 350 taken along section line 24-24 of FIG. 22. For the sake of clarity, FIGS. 22-24 are described together. Support 102 includes a device receiving structure 104, a device receiving structure 106, a gate lead 108, a source lead 110, and a drain lead 112 and has been described with reference to FIGS. 8-12. As described above, support 102 is configured for packaging in a QFN package.

Semiconductor chip 50 is mounted to or bonded to device receiving structure 104. More particularly, a layer of die attach material 130 is formed on surface 104A of device receiving structure 104 and surface 54 of semiconductor chip 50 is placed in die attach material 130. A bonding agent 132 is formed on source bond pad 58 including rectangularly shaped extension 64, drain bond pad 60, source lead 112, and device receiving structure 106. Suitable materials for bonding agent 132 include solder, an electrically conductive adhesive, an electrically conductive die attach material, or the like.

Semiconductor chip 84 is bonded to semiconductor chip 50 and device receiving structure 106 in a flip-chip configuration. Thus, gate bond pad 86 of semiconductor chip 84 is bonded to extension 64 using, for example, bonding agent 132 and source bond 88 of semiconductor chip 84 is bonded to drain bond pad 60 of semiconductor chip 50 using, for example, bonding agent 132.

A clip 133 having terminals 133A and 133B electrically connects source bond pad 18 with source lead 112. Suitable materials for bonding agent 132 have been described above. Source bond pad 58 is electrically connected to Kelvin lead 110 through a bonding wire 134 and gate bond pad 56 is electrically connected to gate lead 108 through a bonding wire 136. Bonding wires such as bonding wires 134 and 136 may be referred to as wirebonds.

As those skilled in the art are aware, support 102, including surfaces 104A and 106A of device receiving structures 104 and 106, respectively, semiconductor chip 50, semiconductor chip 84, and clip 133 may be encapsulated in a protection material (not shown) such as, for example a mold compound. Mold compound 120 may be a portion of the protection material.

Thus, semiconductor component 350 shown in FIGS. 22-24 may be represented schematically by circuit schematic 81 shown in FIG. 5, where the substrate of III-N semiconductor chip 84 is floating.

Figure 25:
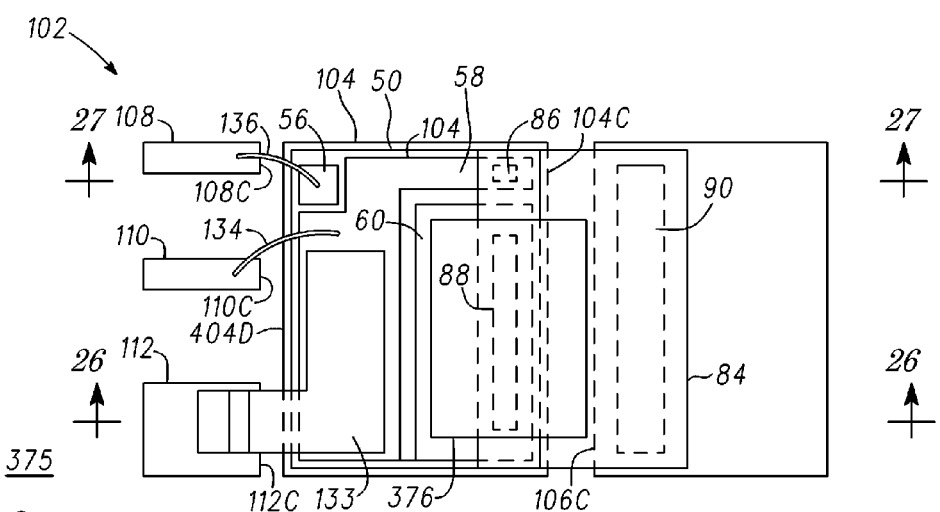
FIG. 25 is a top view of a cascode configured semiconductor component in accordance with another embodiment of the present invention.
Figure 26:
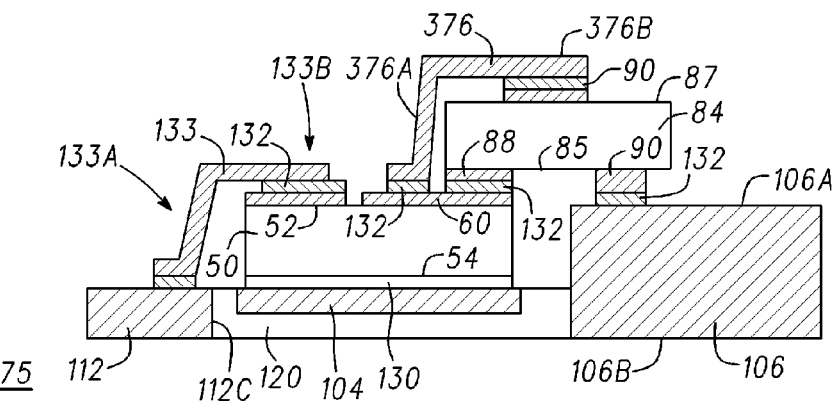
FIG. 26 is a cross-sectional view of the cascode configured semiconductor component of FIG. 25 taken along section line 26-26 of FIG. 25.
Figure 27:
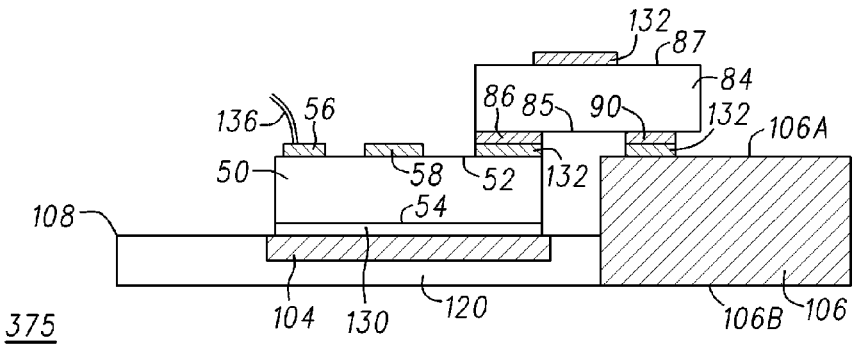
FIG. 27 is a cross-sectional view of the cascode configured semiconductor component of FIG. 25 taken along section line 27-27 of FIG. 25.

FIG. 25 is a top view of a semiconductor component 375 comprising a support 102 to which a semiconductor chip 50 and a semiconductor chip 84 are mounted in accordance with an embodiment of the present invention. FIG. 26 is a cross-sectional view of semiconductor component 375 taken along section line 26-26 of FIG. 25 and FIG. 27 is a cross-sectional view of semiconductor component 375 taken along section line 27-27 of FIG. 25. For the sake of clarity, FIGS. 25-27 are described together. Semiconductor component 375 is similar to semiconductor component 350 described with reference to FIGS. 22-24, except that semiconductor component 375 includes a clip 376 that connects drain bond pad 60 of silicon semiconductor chip 50 to surface 87 of the body of semiconductor material of semiconductor chip 84. More particularly, clip 376 has terminals 376A and 376B where terminal 376A is bonded to drain bond pad 60 through a bonding agent 132 and terminal 376B is bonded to surface 87 of the body of semiconductor material of semiconductor chip 84.

As those skilled in the art are aware, support 102, including surfaces 104A and 106A of device receiving structures 104 and 106, respectively, semiconductor chip 50, semiconductor chip 84, and clips 133 and 376 may be encapsulated in a protection material (not shown) such as, for example a mold compound. Mold compound 120 may be a portion of the protection material. Support 102 is configured for packaging in a QFN package.

Semiconductor component 375 shown in FIGS. 25-27 may be represented schematically by circuit schematic 95 shown in FIG. 6, where the substrate of III-N semiconductor chip 84 is coupled to the drain of semiconductor chip 50 and to the source of semiconductor chip 84.

Figure 28:
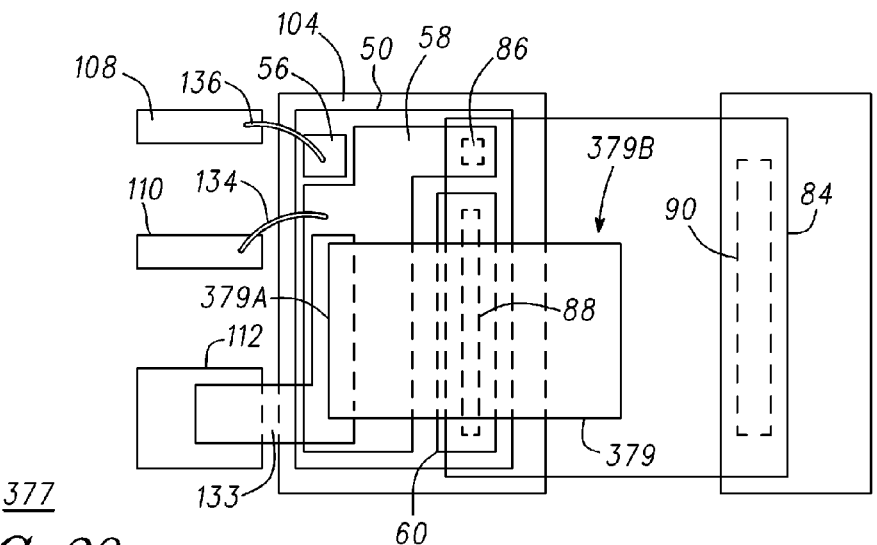
FIG. 28 is a top view of a cascode configured semiconductor component in accordance with another embodiment of the present invention.

FIG. 28 is a top view of a semiconductor component 377 comprising support 102 to which semiconductor chip 50 and a semiconductor chip 84 are mounted in accordance with an embodiment of the present invention. As discussed above, support 102 is configured for use in a QFN package. Semiconductor component 377 differs from semiconductor component 375 in that electrically conductive clip 376 of semiconductor component 375 is replaced by an electrically conductive clip 379 that electrically connects the body/substrate of III-N semiconductor chip 84 to source bond pad 58 of semiconductor chip 50. More particularly, clip 379 has terminals 379A and 379B where terminal 379A is connected to source bond pad 58 through bonding agent 132 and electrically conductive clip 133, and terminal 379B is bonded to surface 87 of the body or substrate of the semiconductor material of III-N semiconductor chip 84

Semiconductor component 377 shown in FIG. 28 may be represented schematically by circuit schematic 97 shown in FIG. 7, where the substrate of III-N semiconductor chip 84 is coupled to the source of semiconductor chip 50.

Figure 29:
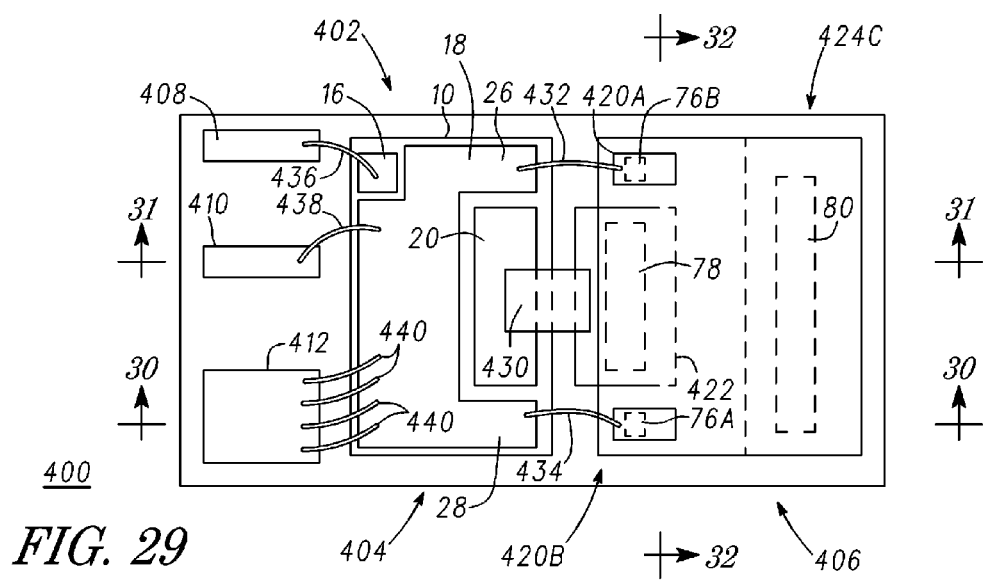
FIG. 29 is a top view of a cascode configured semiconductor component in accordance with another embodiment of the present invention.
Figure 30:
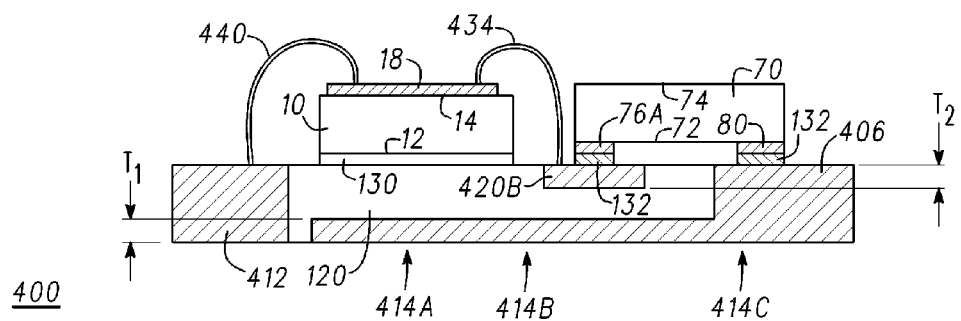
FIG. 30 is a cross-sectional view of the cascode configured semiconductor component of FIG. 29 taken along section line 30-30 of FIG. 29.
Figure 31:
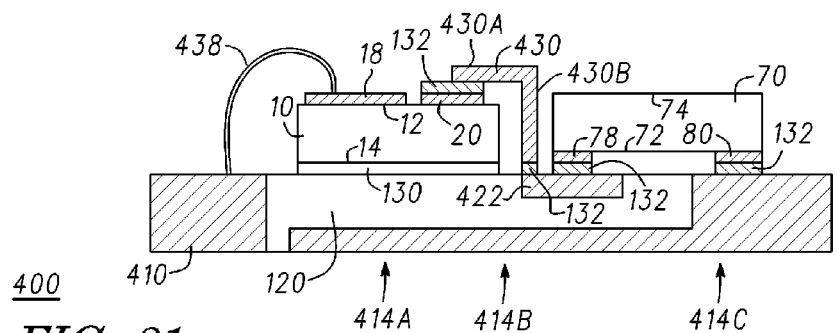
FIG. 31 is a cross-sectional view of the cascode configured semiconductor component of FIG. 29 taken along section line 31-31 of FIG. 29.
Figure 32:
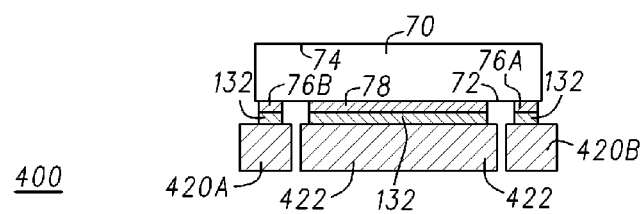
FIG. 32 is a cross-sectional view of the cascode configured semiconductor component of FIG. 29 taken along section line 32-32 of FIG. 29.

FIG. 29 is a top view of a semiconductor component 400 comprising a support 402 to which a semiconductor chip 10 and a semiconductor chip 70 are mounted in accordance with an embodiment of the present invention. FIG. 30 is a cross-sectional view of semiconductor component 400 taken along section line 30-30 of FIG. 29; FIG. 31 is a cross-sectional view of semiconductor component 400 taken along section line 31-31 of FIG. 29; and FIG. 32 is a cross-sectional view of semiconductor component 400 taken along section line 32-32 of FIG. 29. For the sake of clarity, FIGS. 29-32 are described together. Support 402 includes a device receiving structure 404, a device receiving structure 406, a gate lead 408, a Kelvin lead 410, a source lead 412 and configured for packaging in a QFN package. Device receiving structure 404 is comprised of an electrically insulating material such as, for example, a thermally enhanced mold compound having a major surface 404A. Gate lead 408, Kelvin lead 410, and source lead 412 may be referred to as electrically conductive leads.

Device receiving structure 406 is comprised of an electrically conductive structure 414 having an end region 414A, a central region 414B, and an end region 414C. End region 414A and central region 414B have a thickness $T_1$ and end region 414C has a thickness $T_2$, wherein thickness $T_2$ is greater than thickness $T_1$. Thus, end region 14C is thicker than regions 414A and 414B and forms a pedestal portion.

Device receiving structure 406 further includes an electrically conductive structure 420A that serves as a gate lead, an electrically conductive structure 420B that serves as another gate lead, and an electrically conductive structure 422 that serves as a source lead. Electrically conductive structures 420A, 420B, and 422 are electrically isolated from each other.

Semiconductor chip 10 is mounted to or bonded to device receiving structure 404. More particularly, a layer of die attach material 130 is formed on surface 404A of device receiving structure 404 and surface 14 of semiconductor chip 10 is placed in die attach material 130. A bonding agent 132 is formed on source bond pad 18 including rectangularly shaped extensions 26 and 28, drain bond pad 20, source lead 422, and device receiving structure 406. Suitable materials for bonding agent 132 include solder, an electrically conductive adhesive, an electrically conductive die attach material, or the like.

Semiconductor chip 70 is bonded to device receiving structure 406 in a flip-chip configuration. Thus, gate bond pad 76A of semiconductor chip 70 is bonded to gate lead 420B, gate bond pad 76B is bonded to gate bond pad 420A, source bond pad 78 is bonded to source lead 422, and drain bond pad 80 is bonded to end region 414C of device receiving structure 406. In accordance with an embodiment, gate bond pads 76A and 76B are tied to the same potential through the metallization system of semiconductor chip 70.

A clip 430 having terminals 430A and 430B electrically connects drain bond pad 20 of semiconductor die 10 to source lead 422 of semiconductor chip 70. More particularly, terminal 430A is bonded to drain 20 of semiconductor die 10 using a bonding agent 132 and terminal 430B is bonded to source lead 422 using a bonding agent 132.

Suitable materials for bonding agent 132 have been described above. Source bond pad 18 is electrically connected to gate leads 420A and 420B through bonding wires 432 and 434, respectively. Gate bond pad 16 is electrically connected to gate lead 408 through a bonding wire 436; Kelvin lead 410 is electrically connected to source bond pad 18 of semiconductor chip 10 through a bonding wire 438, and source lead 412 is electrically connected to source bond pad 18 thought bonding wires 440. Bonding wires such as bonding wires 432, 434, 436, 438, and 440 may be referred to as wirebonds.

As those skilled in the art are aware, support 402, including device receiving structures 404 and 406, semiconductor chip 10, semiconductor chip 70, and clip 430 may be encapsulated in a protection material such as, for example a mold compound. A mold compound 120 is illustrated that may be a portion of the protection material.

Semiconductor component 400 shown in FIGS. 29-32 may be represented schematically by circuit schematic 81 shown in FIG. 5, where the substrate of III-N semiconductor chip 70 is floating.

Figure 33:
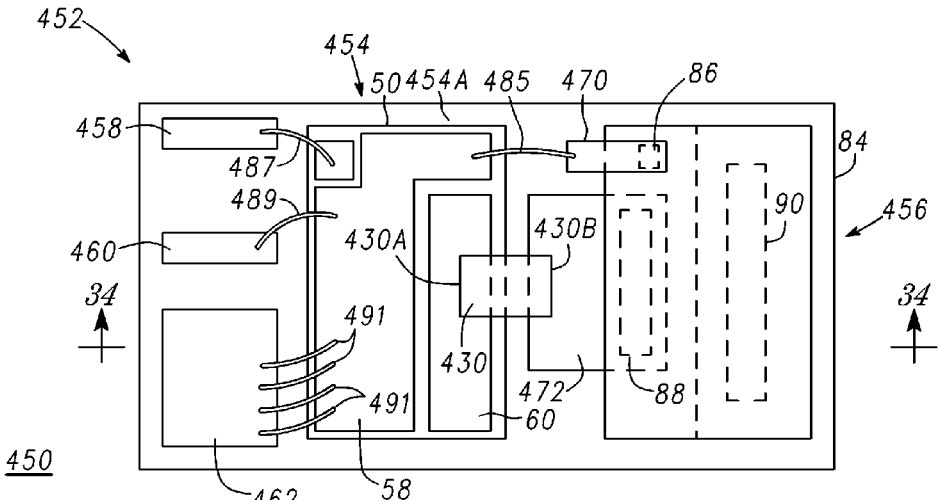
FIG. 33 is a top view of a cascode configured semiconductor component in accordance with another embodiment of the present invention.
Figure 34:
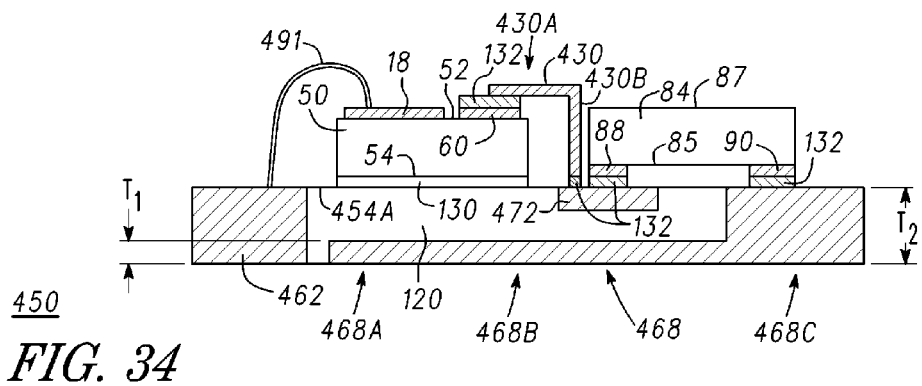
FIG. 34 is a cross-sectional view of the cascode configured semiconductor component of FIG. 33 taken along section line 34-34 of FIG. 33.

FIG. 33 is a top view of a semiconductor component 450 comprising a support 452 to which a semiconductor chip 50 and a semiconductor chip 84 are mounted in accordance with an embodiment of the present invention. FIG. 34 is a cross-sectional view of semiconductor component 450 taken along section line 34-34 of FIG. 33. For the sake of clarity, FIGS. 33 and 34 are described together. Support 452 includes a device receiving structure 454, a device receiving structure 456, a gate lead 458, a Kelvin lead 460, and a source lead 462. Leads 458, 460, and 462 may be referred to as electrically conductive leads or electrically conductive structures. Device receiving structure 454 is comprised of an electrically insulating material such as, for example, a thermally enhanced mold compound having a major surface 454A.

Device receiving structure 456 is comprised of an electrically conductive structure 468 having an end region 468A, a central region 468B, and an end region 468C. End region 468A and central region 468B have a thickness $T_1$ and end region 468C has a thickness $T_2$, wherein thickness $T_2$ is greater than thickness $T_1$. Thus, end region 468C is thicker than regions 468A and 468B and forms a pedestal portion.

Device receiving structure 456 further includes an electrically conductive lead 470 that serves as a gate lead and an electrically conductive lead 472 that serves as a source lead.

Semiconductor chip 50 is mounted to or bonded to device receiving structure 454. More particularly, a layer of die attach material 130 is formed on surface 454A of device receiving structure 454 and surface 54 of semiconductor chip 50 is placed in die attach material 130. A bonding agent 132 is formed on drain bond pad 60 of semiconductor chip 50, gate lead 470 and source lead 472. Suitable materials for bonding agent 132 have been described above.

Semiconductor chip 84 is bonded to device receiving structure 456 in a flip-chip configuration. Thus, gate bond pad 86 of semiconductor chip 84 is bonded to gate lead 470, source bond pad 88 is bonded to source lead 472, and drain bond pad 90 is bonded to end region 468C.

A clip 430 having terminals 430A and 430B electrically connects drain 60 of semiconductor die 50 to source lead 88 of semiconductor chip 84. More particularly, terminal 430A is bonded to drain bond pad 60 of semiconductor die 50 using a bonding agent 132 and terminal 430B is bonded to source lead 472 using a bonding agent 132. Suitable materials for bonding agent 132 have been described above. Source bond pad 58 is electrically connected gate lead 470 through a bonding wire 485. Gate bond pad 56 is electrically connected to gate lead 458 through a bonding wire 487; Kelvin lead 460 is electrically connected to source bond pad 58 of semiconductor chip 50 through a bonding wire 489, and source lead 462 is electrically connected to source bond pad 58 thought bonding wires 491. Bonding wires such as bonding wires 485, 487, 489, and 491 may be referred to as wirebonds.

As those skilled in the art are aware, support 452, including device receiving structures 454 and 456, semiconductor chip 50, semiconductor chip 84, and clip 430 may be encapsulated in a protection material such as, for example a mold compound. Portion 120 of the mold compound is illustrated in FIG. 34.

Semiconductor component 450 shown in FIGS. 33-34 may be represented schematically by circuit schematic 81 shown in FIG. 5, where the substrate of III-N semiconductor chip 70 is floating.

Figure 35:
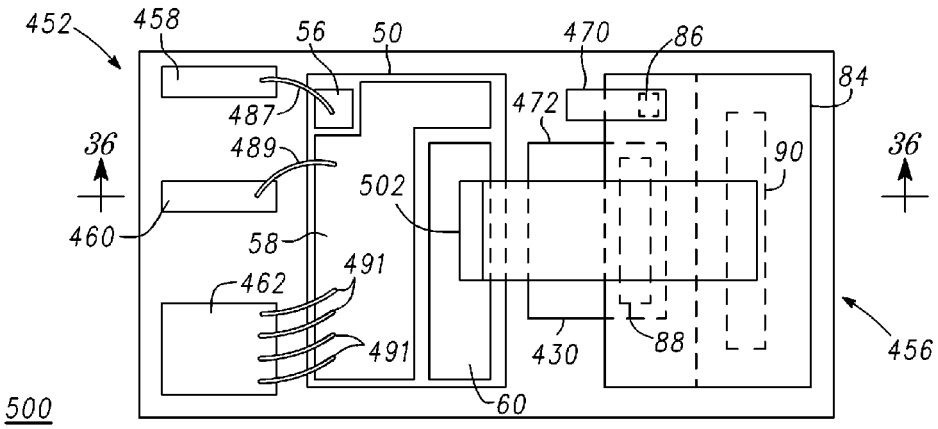
FIG. 35 is a top view of a cascode configured semiconductor component in accordance with another embodiment of the present invention.
Figure 36:
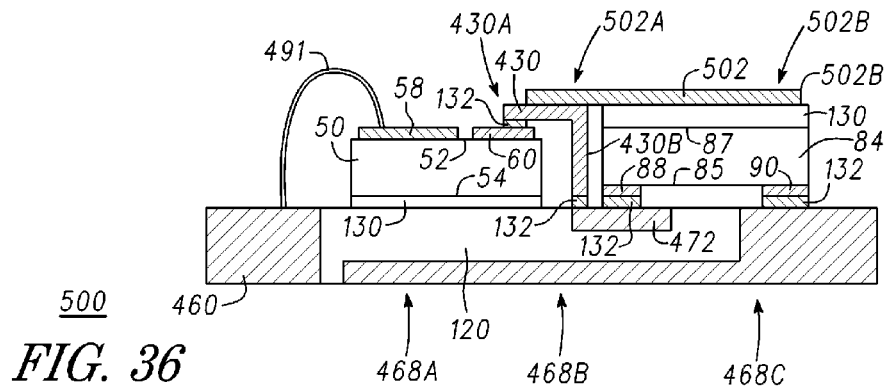
FIG. 36 is a cross-sectional view of the cascode configured semiconductor component of FIG. 35 taken along section line 36-36 of FIG. 35.

FIG. 35 is a top view of a semiconductor component 500 comprising a support 452 to which a semiconductor chip 50 and a semiconductor chip 84 are mounted in accordance with an embodiment of the present invention. FIG. 36 is a cross-sectional view of semiconductor component 500 taken along section line 36-36 of FIG. 35. For the sake of clarity, FIGS. 35 and 36 are described together. Support 452 includes a device receiving structure 454, a device receiving structure 456, a gate lead 458, a Kelvin lead 460, and a source lead 462 and has been described with reference to FIGS. 29 and 30. Support 452 is configured for packaging in a QFN package.

Semiconductor component 500 is similar to semiconductor component 450 described with reference to FIGS. 33 and 34 except that semiconductor component 500 includes a clip 502 that electrically connects drain bond pad 60 of silicon semiconductor chip 50 to surface 87 of the body of semiconductor material of semiconductor chip 84. More particularly, clip 502 has terminals 502A and 502B where terminal 502A is connected to drain bond pad 60 through a bonding agent 132 and terminal 430A of clip 430 and terminal 502B is bonded to surface 87 of the body of semiconductor material of semiconductor chip 70 using an electrically conductive die attach material 130.

Semiconductor component 500 shown in FIGS. 35-36 may be represented schematically by circuit schematic 95 shown in FIG. 6, where the substrate of III-N semiconductor chip 84 is electrically connected to drain bond pad 60 of semiconductor chip 50 and to the source bond pad 88 of semiconductor chip 84.

Figure 37:
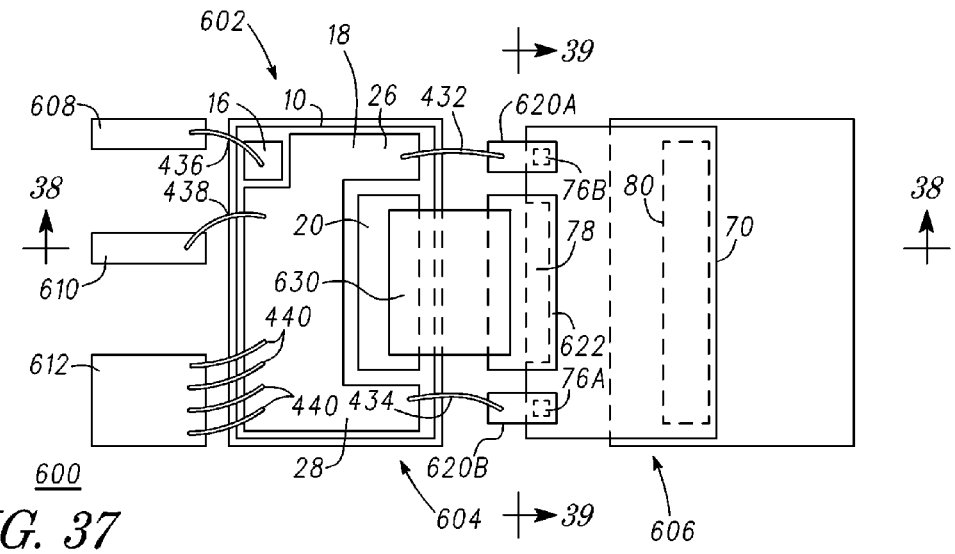
FIG. 37 is a top view of a cascode configured semiconductor component in accordance with another embodiment of the present invention.
Figure 38:
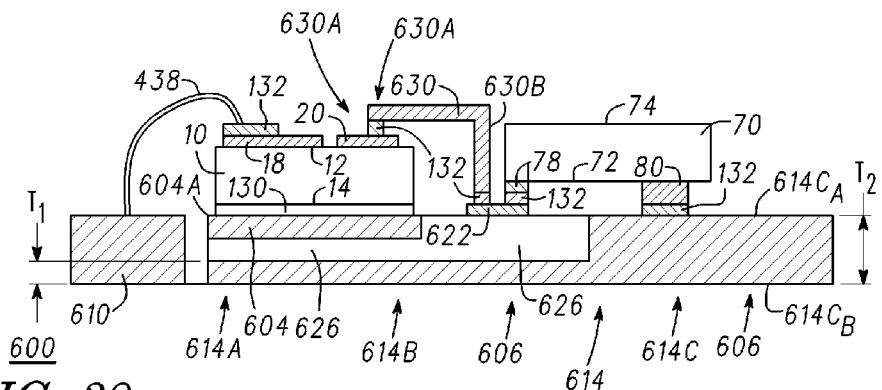
FIG. 38 is a cross-sectional view of the cascode configured semiconductor component of FIG. 37 taken along section line 38-38 of FIG. 37.
Figure 39:
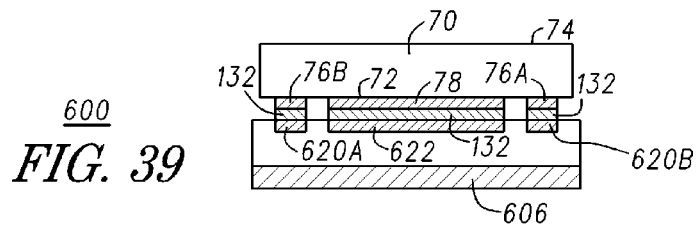
FIG. 39 is a cross-sectional view of the cascode configured semiconductor component of FIG. 37 taken along section line 39-39 of FIG. 37.

FIG. 37 is a top view of a semiconductor component 600 comprising a support 602 to which a semiconductor chip 10 and a semiconductor chip 70 are mounted in accordance with an embodiment of the present invention. FIG. 38 is a cross-sectional view of semiconductor component 600 taken along section line 38-38 of FIG. 37 and FIG. 39 is a cross-sectional view of semiconductor component 600 taken along section line 39-39 of FIG. 37. For the sake of clarity, FIGS. 37-39 are described together. Support 602 includes a device receiving structure 604 and a device receiving structure 606. Device receiving structure 604 is comprised of a layer of an electrically conductive material such as, for example, copper and has a major surface 604A. Support 602 further includes electrically conductive leads 608, 610, and 612 that serve as a gate lead, a Kelvin lead, and a source lead, respectively.

Device receiving structure 606 is comprised of an electrically conductive structure 614 having an end region 614A, a central region 614B, and an end region 614C, which end region 614C serves as a drain lead and may be referred to as a drain lead. End region 614C has opposing surfaces $614C_A$ and $614C_B$. End region 614A and central region 614B have a thickness $T_1$ and end region 614C has a thickness $T_2$, wherein thickness $T_2$ is greater than thickness $T_1$. Thus, end region 614C is thicker than regions 614A and 614B and forms a pedestal portion.

Device receiving structure 606 further includes an electrically conductive lead 620A that serves as a gate lead, an electrically conductive structure 620B that serves as another gate lead, and an electrically conductive lead 622 that serves as a source lead.

In accordance with an embodiment, a layer of ceramic material 626 is formed at least on regions 614A and 614B and electrically conductive layer 604 and gate leads 620A and 620B and source lead 622 are bonded to ceramic layer 626. By way of example, regions 614A, 614B, ceramic layer 626, gate leads 620A and 620B, and source lead 622 form a direct bonded copper structure 628.

Semiconductor chip 10 is mounted to or bonded to device receiving structure 604. More particularly, a layer of die attach material 130 is formed on surface 604A of device receiving structure 604 and surface 54 of semiconductor chip 10 is placed in die attach material 130. A bonding agent 132 is formed on source bond pad 18 including rectangularly shaped extensions 26 and 28, drain bond pad 20, device receiving structure 106, gate leads 620A and 620B, source lead 622, and surface $614C_A$ of end 614C. Suitable materials for bonding agent 132 have been described above.

Semiconductor chip 70 is bonded to device receiving structure 606 in a flip-chip configuration. Thus, gate bond pad 76A of semiconductor chip 70 is bonded to gate lead 620B, gate bond pad 76B is bonded to gate bond pad 620A, source bond pad 78 is bonded to source lead 622, and drain bond pad 80 is bonded to surface $614C_T$ of end region 614C of device receiving structure 606.

A clip 630 having terminals 630A and 630B electrically connects drain 20 of semiconductor die 10 to source lead 622 of semiconductor chip 70. More particularly, terminal 630A is bonded to drain 20 of semiconductor die 10 using a bonding agent 132 and terminal 630B is bonded to source lead 622 using a bonding agent 132. Suitable materials for bonding agent 132 have been described above. Source bond pad 18 is electrically connected to gate lead 620A through a bonding wire 432 and to gate lead 620B through a bonding wire 434. Gate bond pad 16 is electrically connected to gate lead 608 through a bonding wire 436; Kelvin lead 610 is electrically connected to source bond pad 18 of semiconductor chip 10 through a bonding wire 438, and source lead 612 is electrically connected to source bond pad 18 thought bonding wires 440. Bonding wires such as bonding wires 432, 434, 436, 438, and 440 may be referred to as wirebonds.

As those skilled in the art are aware, support 602, including device receiving structures 604 and 606, semiconductor chip 10, semiconductor chip 70, and clip 630 may be encapsulated in a protection material such as, for example a mold compound 138. Mold compound 138 is shown in FIG. 33 by a broken line or a dashed line.

Semiconductor component 600 shown in FIGS. 37-39 may be represented schematically by circuit schematic 81 shown in FIG. 5, where the substrate of III-N semiconductor chip 70 is floating.

Figure 40:
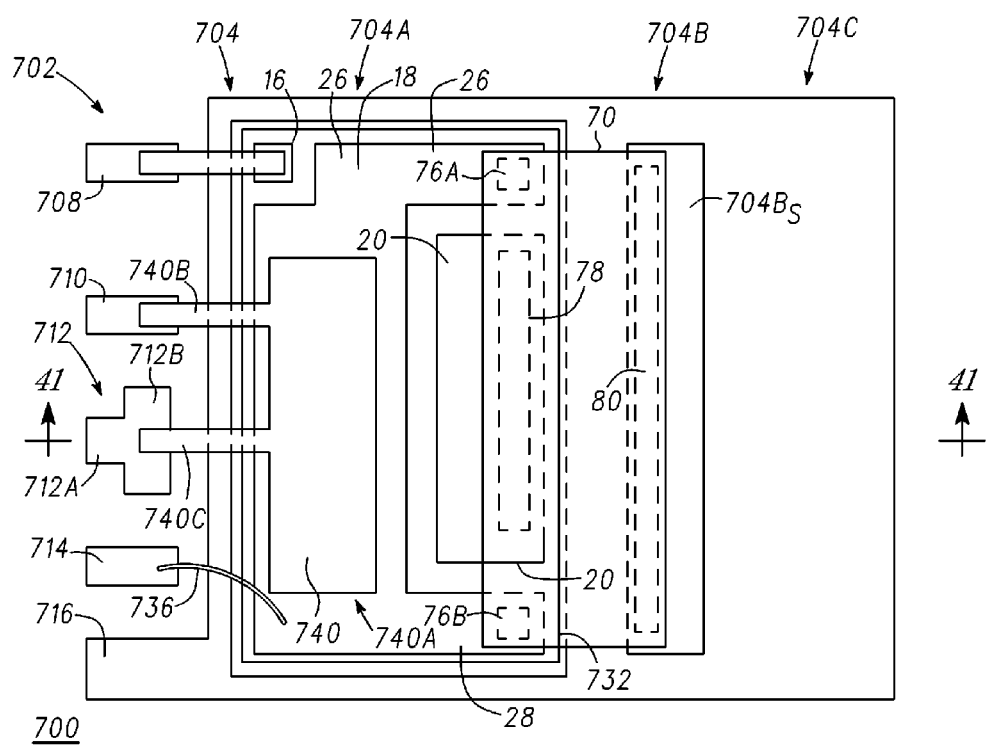
FIG. 40 is a top view of a cascode configured semiconductor component in accordance with another embodiment of the present invention.
Figure 41:
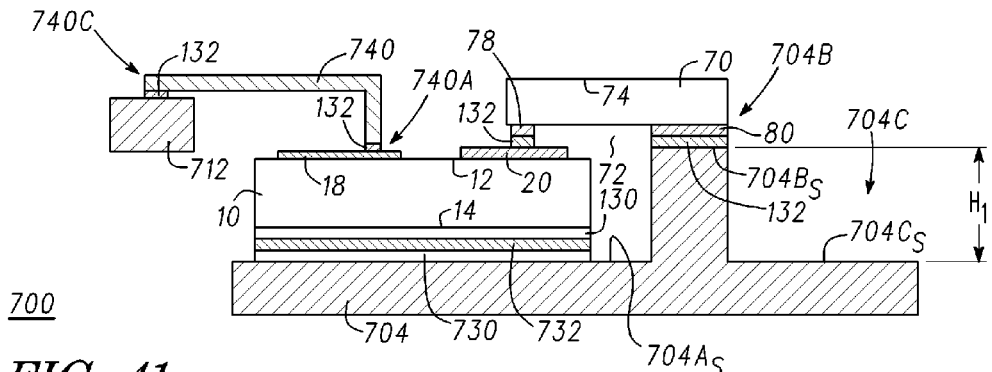
FIG. 41 is a cross-sectional view of the cascode configured semiconductor component of FIG. 40 taken along section line 41-41 of FIG. 40.

FIG. 40 is a top view of a semiconductor component 700 comprising a support 702 that includes a device receiving structure 704 in accordance with an embodiment of the present invention. FIG. 41 is a cross-sectional view of semiconductor component 700 taken along section line 41-41 of FIG. 40. Device receiving structure 704 is a rectangularly shaped electrically conductive pad that includes a region 704A separated from a region 704C by a pedestal region 704B. Region 704A has a surface 704A$_S$, region 704B has a region 704B$_S$, and region 704C has a region 704C$_S$, wherein surfaces 704A$_S$ and 704C$_S$ are substantially coplanar, and surface 704B$_S$ is in a plane above the coplanar plane in which surfaces 704A$_S$ and 704C$_S$ are located.

Support 702 is further configured to have a rectangularly shaped electrically conductive structure 708 adjacent to but electrically isolated from device receiving structure 704. In accordance with another embodiment, rectangularly shaped electrically conductive structure 708 serves as a gate lead.

Support 702 is further configured to have a rectangularly shaped electrically conductive structure 710 adjacent to but electrically isolated from device receiving structure 704. In accordance with another embodiment, rectangularly shaped electrically conductive structure 710 serves as a Kelvin lead.

Support 702 is further configured to have an electrically conductive structure 712 adjacent to but electrically isolated from device receiving structure 702. Electrically conductive structure 712 serves as a source lead. By way of example, source lead 712 is comprised of a rectangular portion 712A and a rectangular portion 712B, wherein portions 712A and 712B form a "T-shape."

Support 702 is further configured to have a rectangularly shaped electrically conductive structure 714 adjacent to but electrically isolated from device receiving structure 704. In accordance with another embodiment, rectangularly shaped electrically conductive structure 714 serves as a sense lead.

Device receiving structure 702 has an extension 716 extending from a corner of rectangularly shaped support 702, wherein extension 716 serves as a drain lead.

An electrically insulating material 730 is formed on a region 704A of device region 704. By way of example, electrically insulating material 730 is ceramic. A layer of electrically conductive material 732 is formed on electrically insulating material 730. By way of example, electrically conductive layer 732 is copper. It should be noted that region 704A, ceramic layer 730, electrically conductive layer 732 may be configured to form a direct bonded copper structure.

Semiconductor chip 10 is mounted to or bonded to device receiving structure 704. More particularly, a layer of die attach material 130 is formed on the surface of electrically conductive layer 732 and surface 14 of semiconductor chip 10 is placed in die attach material 130. A bonding agent 132 is formed on source bond pad 18 including rectangularly shaped extensions 26 and 28, gate bond pad 16, and surface 704B$_S$ of region 704B.

Semiconductor chip 70 is bonded to semiconductor chip 10 and to surface 706B of region 706 in a flip-chip configuration. Thus, gate bond pad 76A of semiconductor chip 70 is bonded to extension 26 of source bond pad 18, gate bond pad 76B is bonded to extension 28 of source bond pad 18, source bond pad 78 of semiconductor chip 70 is bonded to drain bond pad 20 of semiconductor chip 10, and drain bond pad 80 is bonded to surface 704B$_S$ of region 704B. It should be noted that pedestal 704B has a height H$_1$ and that height H$_1$ is configured so that the thickness of direct bonded structure 705 and semiconductor die 10 is substantially equal to height H$_1$.

A clip 740 electrically connects source bond pad 18 of semiconductor die 10 to source lead 712 and to Kelvin lead 710. More particularly, clip 740 has a body region 740A, a terminal 740B and a terminal 740C, wherein terminals 740B and 740C extend from body region 740A, terminal 740B is bonded to Kelvin lead 710 using a bonding agent 132 and terminal 740C is bonded to source lead 712 using bonding agent 132. Suitable materials for bonding agent 132 have been described above. Sense lead 714 is electrically connected to electrically conductive layer 732, and thus to the body of semiconductor material of semiconductor chip 10 through a bonding wire 736. A bonding wire such as bonding wire 736 may be referred to as a wirebond.

As those skilled in the art are aware, support 702, including device receiving structures 704 and 706, semiconductor chip 10, semiconductor chip 70, and clip 740 may be encapsulated in a protection material such as, for example a mold compound. It should be appreciated that semiconductor component 700 may be configured for mounting in a through hole package having, for example, a TO-220 outline, a TO-247 outline, a TO-264 outline, a TO-257 outline, or the like.

Semiconductor component 700 shown in FIGS. 40-41 may be represented schematically by circuit schematic 81 shown in FIG. 5, where the substrate of III-N semiconductor chip 70 is floating.

Figure 42:
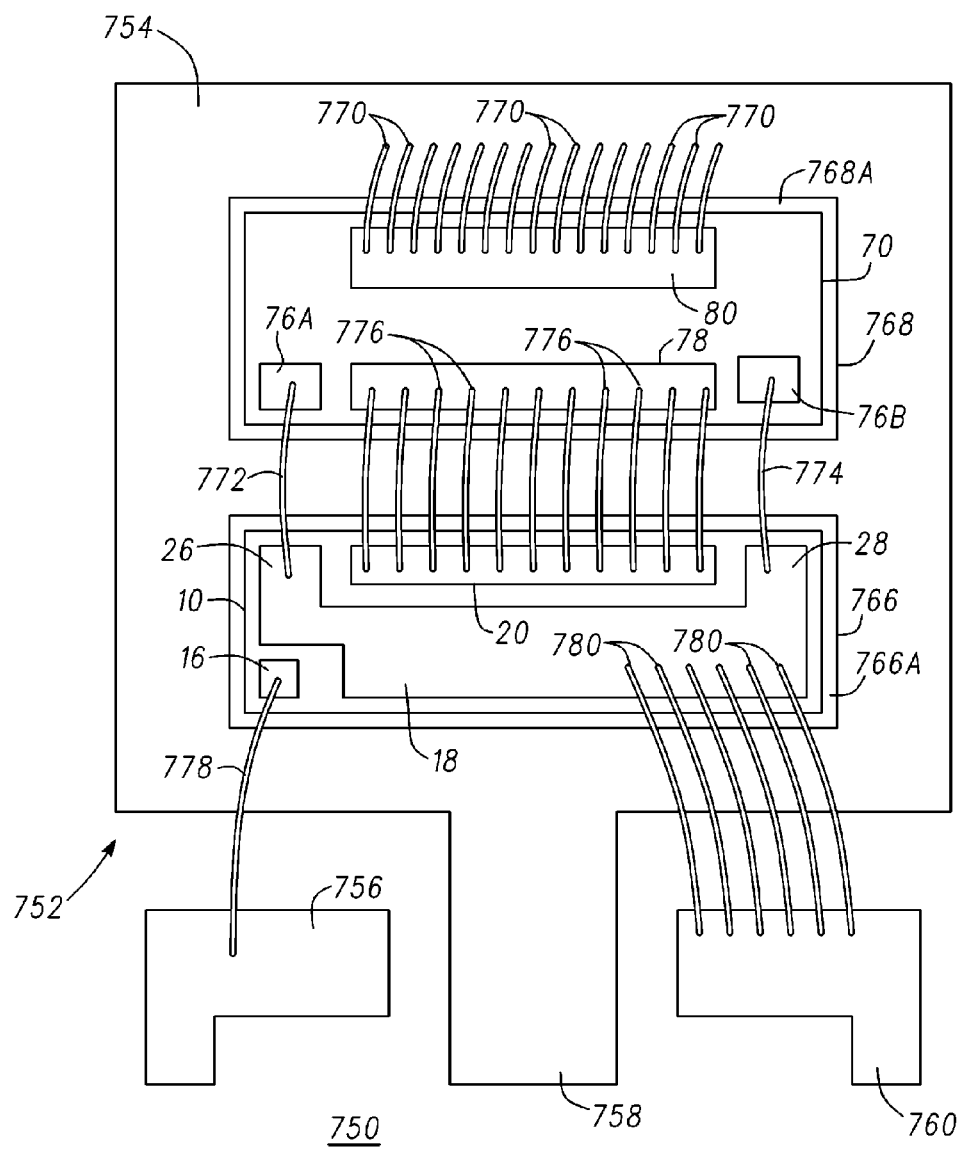
FIG. 42 is a top view of a cascode configured semiconductor component in accordance with another embodiment of the present invention.

FIG. 42 is a top view of a semiconductor component 750 comprising a support 752 having a semiconductor chip 10 and a semiconductor chip 70 bonded thereto in accordance with an embodiment of the present invention. What is shown in FIG. 38 is a rectangularly shaped, electrically conductive, support or support structure 752 having a surface 754. Semiconductor component 750 further includes a gate lead 756, a drain lead 758, and a source lead 760, where gate lead 756 and source lead 760 are electrically isolated from support 752 and drain lead 758 extends from support 752. Thus, support 752 and drain lead 758 form a unitary structure. Semiconductor component 750 is configured so that drain lead 758 is between gate lead 756 and source lead 760. It should be appreciated that semiconductor component 750 may be configured for mounting in a through hole package having, for example, a TO-220 outline, a TO-247 outline, a TO-264 outline, a TO-257 outline, or the like. Thus, support structure 752 is at different level than leads 756 and 760 and at a different level than a portion of lead 758.

A direct bonded copper substrate 766 having a surface 766A is bonded to a portion of surface 754 and a direct bonded copper substrate 768 having a surface 768A is bonded to another portion of surface 754. A semiconductor chip 10 is mounted to or bonded to surface 766A and a semiconductor chip 70 is mounted to or bonded to surface 768A. More particularly, a layer of die attach material is formed on surface 766A and on surface 768A and surface 14 of semiconductor chip 10 is placed in the die attach material that is on surface 766A and surface 74 is placed in the die attach material that is on surface 768A.

Drain bond pad 80 of semiconductor chip 70 is electrically connected to support 752 by one or more bonding wires 770; gate bond pads 76A and 76B are electrically connected to extensions 26 and 28 of source bond pad 18 by bonding wires 772 and 774, respectively, and source bond pad 78 of semiconductor chip 70 is electrically connected to drain bond pad 20 of semiconductor chip 10 by one or more bonding wires 776. Gate bond pad 16 of semiconductor chip 10 is electrically connected to gate lead 756 by a bonding wire 778 and source bond pad 18 is electrically connected to source lead 760 by one or more bonding wires 780. Bonding wires such as bonding wires 770, 772, 774, 776, 778, and 780 may be referred to as wirebonds.

It should be noted that bonding wires 770 may be replaced by an electrically conductive clip or interconnect, bonding wires 772 and 774 may be replaced by an electrically conductive clip or interconnect, bonding wires 776 may be replaced by an electrically conductive clip or interconnect, bonding wire 778 may be replaced by an electrically conductive clip or interconnect, and bonding wires 780 may be replaced by an electrically conductive clip or interconnect.

As those skilled in the art are aware, support 770, including support 752, direct bonded copper substrates 766 and 768, and bonding wires 770-780 may be encapsulated in a protection material such as, for example a mold compound. Although an insulated metal substrate such as, for example, direct bonded copper substrates 766 and 768 have been described as being bonded to support 752, this is not a limitation of the present invention. Alternatively, layers of electrically insulating material may be formed on portions of support 770. Then, a layer of electrically conductive material may be formed on the layers of insulating material. By way of example, the layers of electrically conductive material is copper. Techniques for forming an insulating material on an electrically conductive substrate such as a leadframe and for forming an electrically conductive material on an insulating material are known to those skilled in the art.

Semiconductor component 750 shown in FIG. 42 may be represented schematically by circuit schematic 81 shown in FIG. 5, where the substrate of III-N semiconductor chip 70 is floating.

Figure 43:
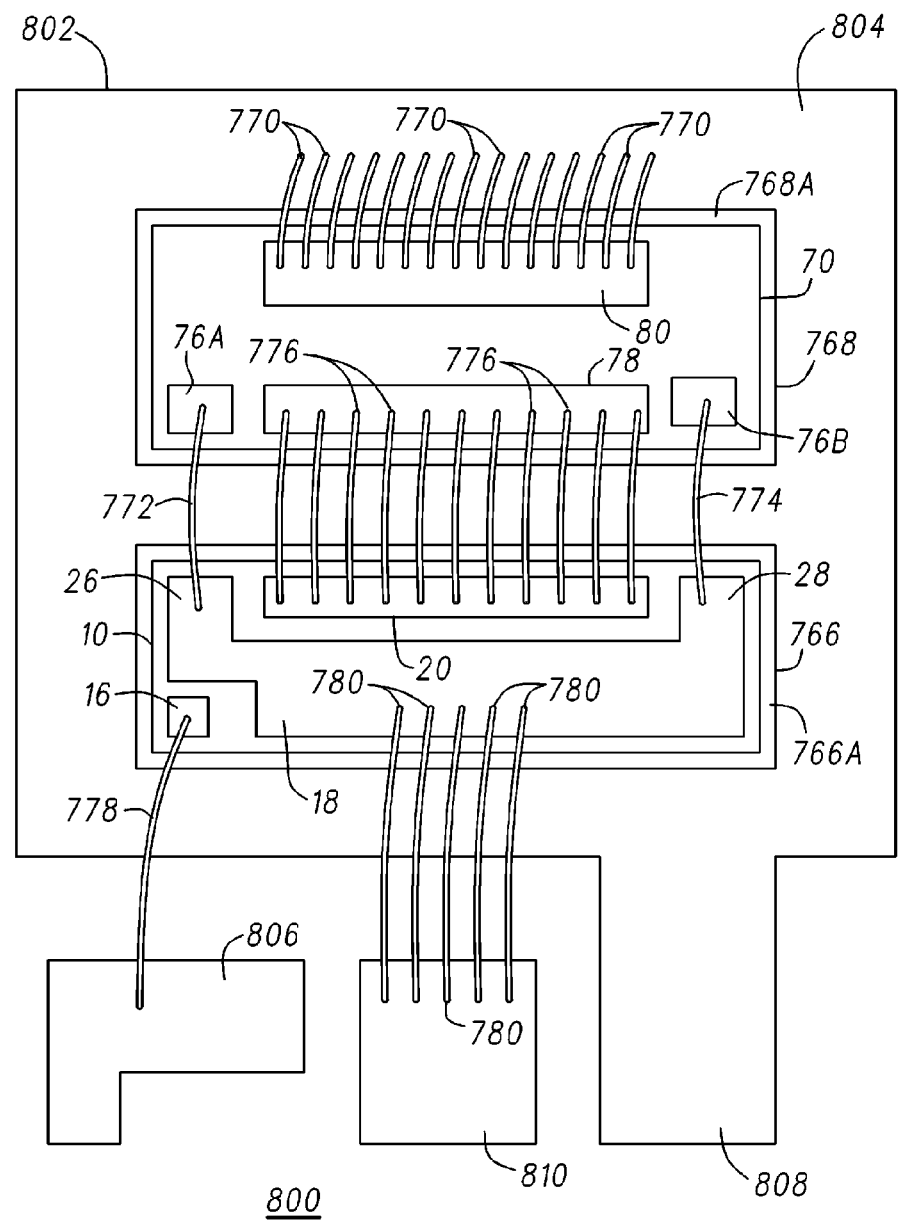
FIG. 43 is a top view of a cascode configured semiconductor component in accordance with another embodiment of the present invention.

FIG. 43 is a top view of a semiconductor component 800 comprising a support 802 having a semiconductor chip 10 and a semiconductor chip 70 bonded thereto in accordance with an embodiment of the present invention. What is shown in FIG. 39 is a rectangularly shaped, electrically conductive, support or support structure 802 having a surface 804. Semiconductor component 800 further includes a gate lead 806, a drain lead 808, and a source lead 810, where gate lead 806 and source lead 810 are electrically isolated from support 802 and drain lead 808 extends from support 802. Thus, support 802 and drain lead 808 form a unitary structure. Semiconductor component 800 is configured so that source lead 810 is between gate lead 806 and drain lead 808. It should be appreciated that semiconductor component 800 may be configured for mounting in a through hole package having, for example, a TO-220 outline, a TO-247 outline, a TO-264 outline, a TO-257 outline, or the like. Thus, support structure 802 is at different level than leads 806 and 810 and at a different level than a portion of lead 808.

A direct bonded copper substrate 766 having a surface 766A is bonded to a portion of surface 804 and a direct bonded copper substrate 768 having a surface 768A is bonded to another portion of surface 804. A semiconductor chip 10 is mounted to or bonded to surface 766A and a semiconductor chip 70 is mounted to or bonded to surface 768A. More particularly, a layer of die attach material is formed on surface 766A and on surface 768A and surface 14 of semiconductor chip 10 is placed in the die attach material that is on surface 766A and surface 74 is placed in the die attach material that is on surface 768A. As those skilled in the art are aware, a direct bonded copper substrate such as, for example, direct bonded copper substrates 766 and 768 may be comprised of a ceramic material having opposing surfaces wherein a layer of copper is formed on one of the opposing surfaces and another layer of copper is formed on the other of the opposing surfaces.

Drain bond pad 80 of semiconductor chip 70 is electrically connected to support 802 by one or more bonding wires 770; gate bond pads 76A and 78A are electrically connected to extensions 26 and 28 of source bond pad 18 by bonding wires 772 and 774, respectively, and source bond pad 78 of semiconductor chip 70 is electrically connected to drain bond pad 20 of semiconductor chip 10 by one or more bonding wires 776. Gate bond pad 16 of semiconductor chip 10 is electrically connected to gate lead 756 by a bonding wire 778 and source bond pad 18 is electrically connected to source lead 760 by one or more bonding wires 780. Bonding wires such as bonding wires 770, 772, 774, 776, 778, and 780 may be referred to as wirebonds.

It should be noted that bonding wires 770 may be replaced by an electrically conductive clip or interconnect, bonding wires 772 and 774 may be replaced by an electrically conductive clip or interconnect, bonding wires 776 may be replaced by an electrically conductive clip or interconnect, bonding wire 778 may be replaced by an electrically conductive clip or interconnect, and bonding wires 780 may be replaced by an electrically conductive clip or interconnect.

As those skilled in the art are aware, support 802, direct bonded copper substrates 766 and 768, and bonding wires 770-780 may be encapsulated in a protection material such as, for example a mold compound. Although an insulated metal substrate such as, for example, direct bonded copper substrates 766 and 768 are described as being bonded to support 802, this is not a limitation of the present invention. Alternatively, layers of electrically insulating material may be formed on portions of support 802. Then, a layer of electrically conductive material may be formed on the layers of insulating material. By way of example, the layers of electrically conductive material is copper. Techniques for forming an insulating material on an electrically conductive substrate such as a leadframe and for forming an electrically conductive material on an insulating material are known to those skilled in the art.

Semiconductor component 800 shown in FIG. 43 may be represented schematically by circuit schematic 81 shown in FIG. 5, where the substrate of III-N semiconductor chip 70 is floating.

Figure 44:
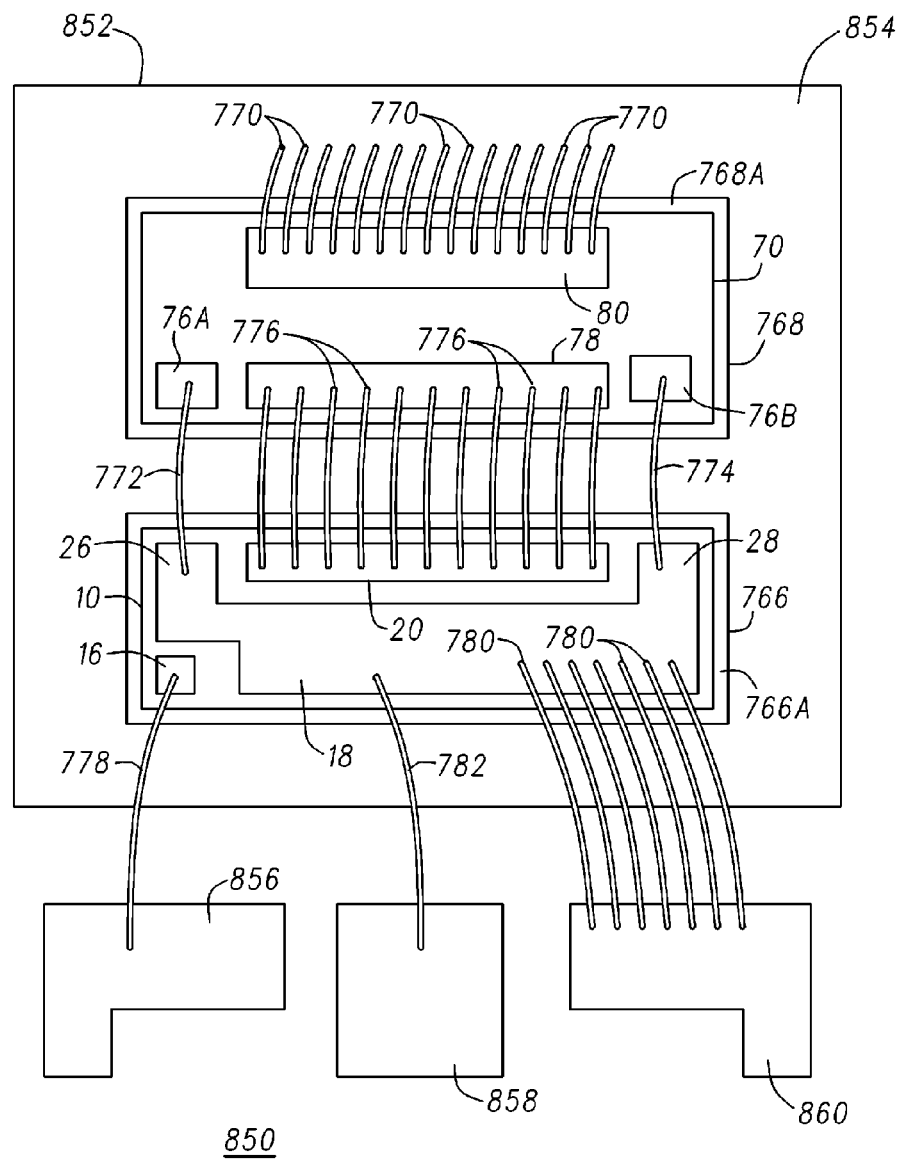
FIG. 44 is a top view of a cascode configured semiconductor component in accordance with another embodiment of the present invention.

FIG. 44 is a top view of a semiconductor component 850 comprising a support 852 having a semiconductor chip 10 and a semiconductor chip 70 bonded thereto in accordance with an embodiment of the present invention. What is shown in FIG. 40 is a rectangularly shaped, electrically conductive, support or support structure 852 having a surface 854. Semiconductor component 850 further includes a gate lead 856, a Kelvin lead 858, and a source lead 860, where gate lead 856, Kelvin lead 858, and source lead 860 are electrically isolated from support 852. A bottom surface of support 852 serves as a drain lead of semiconductor component 850. Semiconductor component 850 is configured so that Kelvin lead 858 is between gate lead 856 and source lead 860. Support 852 is configured to be packaged in a QFN package.

A direct bonded copper substrate 766 having a surface 766A is bonded to a portion of surface 854 and a direct bonded copper substrate 768 having a surface 768A is bonded to another portion of surface 854. A semiconductor chip 10 is mounted to or bonded to surface 766A and a semiconductor chip 70 is mounted to or bonded to surface 768A. More particularly, a layer of die attach material 130 is formed on surface 766A and on surface 768A and surface 14 of semiconductor chip 10 is placed in die attach material 130 that is on surface 766A and surface 74 is placed in die attach material 130 that is on surface 768A.

Drain bond pad 80 of semiconductor chip 70 is electrically connected to support 852 by one or more bonding wires 770; gate bond pads 76A and 78A are electrically connected to extensions 26 and 28 of source bond pad 18 by bonding wires 772 and 774, respectively, and source bond pad 78 of semiconductor chip 70 is electrically connected to drain bond pad 20 of semiconductor chip 10 by one or more bonding wires 776. Gate bond pad 16 of semiconductor chip 10 is electrically connected to gate lead 856 by a bonding wire 778 and source bond pad 18 is electrically connected to source lead 860 by one or more bonding wires 780, and source bond pad 18 of semiconductor chip 10 is electrically connected to Kelvin lead 858 by a bonding wire 782. Bonding wires such as bonding wires 770, 772, 774, 776, 778, 780, and 782 may be referred to as wirebonds.

It should be noted that bonding wires 770 may be replaced by an electrically conductive clip or interconnect, bonding wires 772 and 774 may be replaced by an electrically conductive clip or interconnect, bonding wires 776 may be replaced by an electrically conductive clip or interconnect, bonding wire 778 may be replaced by an electrically conductive clip or interconnect, bonding wires 780 may be replaced by an electrically conductive clip or interconnect, and bonding wire 782 may be replaced by an electrically conductive clip or interconnect.

As those skilled in the art are aware, support 852, direct bonded copper substrates 766 and 768, and bonding wires 770-782 may be encapsulated in a protection material such as, for example a mold compound. Although an insulated metal substrate such as, for example, direct bonded copper substrates 766 and 768 are described as being bonded to support 852, this is not a limitation of the present invention. Alternatively, layers of electrically insulating material may be formed on portions of support 802. Then, a layer of electrically conductive material may be formed on the layers of insulating material. By way of example, the layer of electrically conductive material is copper. Techniques for forming an insulating material on an electrically conductive substrate such as a leadframe and for forming an electrically conductive material on an insulating material are known to those skilled in the art.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. A semiconductor component, comprising:
   a support having a first device receiving structure, a second device receiving structure, a first lead, a second lead, and a third lead;
   a first semiconductor chip having a first surface and a second surface, wherein a first gate bond pad extends from a first portion of the first surface, a source bond pad extends from a second portion of the first surface, and a drain bond pad extends from a third portion of the first surface, the second surface of the first semiconductor chip bonded to the first device receiving structure, the first semiconductor chip configured from a silicon semiconductor material;
   a second semiconductor chip having a first surface and a second surface, a gate bond pad of the second semiconductor chip extends from a first portion of the first surface of the second semiconductor chip, a source bond pad of the second semiconductor chip extends from a second portion of the first surface of the second semiconductor chip, and a drain bond pad extends from a third portion of the first surface of the second semiconductor chip, the second semiconductor chip config-
ured from a III-nitride semiconductor material, the source bond pad of the second semiconductor chip electrically coupled to the drain bond pad of the first semiconductor chip, the gate bond pad of the second semiconductor chip electrically coupled to the source bond pad of the first semiconductor chip, and the drain bond pad of the second semiconductor chip electrically coupled to the second device receiving structure;
   a first electrical interconnect coupled between the gate bond pad of the first semiconductor device and the first lead; and
   a second electrical interconnect coupled between the source bond pad of the first semiconductor chip and the third lead.

2. The semiconductor component of claim 1, further including a third electrical interconnect coupled between the second lead and the source bond pad of the first semiconductor chip.

3. The semiconductor component of claim 2, wherein the first electrical interconnect is a bond wire, the third electrical interconnect is a bond wire, and the second electrical interconnect is a first clip.

4. The semiconductor component of claim 2, wherein the first electrical interconnect is a bond wire, the third electrical interconnect is a first portion of a clip, and the second electrical interconnect is a second portion of a clip.

5. The semiconductor component of claim 1, wherein the second device receiving structure includes a pedestal.

6. The semiconductor component of claim 1, further including a third electrical interconnect coupled between the second surface of the second semiconductor chip and the drain bond pad of the first semiconductor chip.

7. The semiconductor component of claim 1, wherein the second semiconductor chip is coupled to the first semiconductor chip in a flip-chip configuration.

8. The semiconductor component of claim 1, wherein the second device receiving structure comprises a first electrically conductive structure, a second electrically conductive structure, and a third electrically conductive structure.

9. The semiconductor component of claim 8, wherein the second surface of the first semiconductor chip is coupled to a first portion of a mold compound and second device receiving structure comprises a first electrically conductive structure and a second electrically conductive structure, a second portion of the mold compound between the first electrically conductive structure and the second electrically conductive structure.

10. The semiconductor component of claim 9, wherein the source bond pad of the second semiconductor chip is electrically coupled to the first electrically conductive material of the first device receiving structure and the drain bond pad of the second semiconductor chip is electrically coupled to a first portion of the second device receiving structure and the gate bond pad of the second semiconductor chip is electrically coupled to a second portion of the second device receiving structure.

11. The semiconductor component of claim 10, wherein the drain bond pad of the first semiconductor chip is electrically coupled to the first electrically conductive structure of the second device receiving structure.

12. The semiconductor component of claim 11, wherein the drain bond pad of the first semiconductor chip is electrically coupled to the first electrically conductive structure of the second device receiving structure by a first clip.

13. The semiconductor component of claim 12, further including a first bond wire coupled between the source bond pad of the first semiconductor chip and the third electrically conductive structure of the second device receiving structure.

14. The semiconductor component of claim 12, further including a second clip coupled between the first clip and the second surface of the second semiconductor chip.

15. A semiconductor component, comprising:
a support comprising an electrically conductive substrate having a first surface and a second surface, the support further including a first lead, a second lead, and a third lead;
a first dielectric material coupled to a first portion of the first surface of the support;
a first semiconductor chip having a first surface and a second surface, wherein a first gate bond pad extends from a first portion of the first surface of the first semiconductor chip, a source bond pad extends from a second portion of the first surface of the first semiconductor chip, and a drain bond pad extends from a third portion of the first surface of the first semiconductor chip, the second surface of the first semiconductor chip bonded to the first dielectric material, the first semiconductor chip configured from a silicon semiconductor material;
a second semiconductor chip having a first surface and a second surface, a gate bond pad of the second semiconductor chip extends from a first portion of the first surface of the second semiconductor chip a source bond pad of the second semiconductor chip extends from a second portion of the first surface of the second semiconductor chip, and a drain bond pad extends from a third portion of the first surface of the second semiconductor chip, the second semiconductor chip configured from a III-nitride semiconductor material, the source bond pad of the second semiconductor chip electrically coupled to the drain bond pad of the first semiconductor chip, the gate bond pad of the second semiconductor chip electrically coupled to the source bond pad of the first semiconductor chip, and the drain bond pad of the second semiconductor chip electrically coupled to the support;
a first electrical interconnect coupled between the gate bond pad of the first semiconductor chip and the first lead; and
a second electrical interconnect coupled between the source bond pad of the first semiconductor chip and the second lead.

16. The semiconductor component of claim 15, wherein the second semiconductor chip is electrically coupled to the first semiconductor chip in a flip chip configuration.

17. The semiconductor component of claim 15, wherein the first lead, the second lead, and the third lead are electrically isolated from the electrically conductive substrate.

18. A method for manufacturing a semiconductor component, comprising:
providing a support having a first device receiving structure, a second device receiving structure, a first lead, a second lead, and a third lead;
coupling a first semiconductor chip to the first device receiving area, the first semiconductor chip having a first surface and a second surface, wherein a first gate bond pad extends from a first portion of the first surface, a source bond pad extends from a second portion of the first surface, and a drain bond pad extends from a third portion of the first surface, the second surface of the first semiconductor chip bonded to the first device receiving structure, the first semiconductor chip configured from a silicon semiconductor material;
coupling a second semiconductor chip to the second device receiving area, the second semiconductor chip having a first surface and a second surface, a gate bond pad of the second semiconductor chip extends from a first portion of the first surface of the second semiconductor chip, a source bond pad of the second semiconductor chip extends from a second portion of the first surface of the second semiconductor chip, and a drain bond pad extends from a third portion of the first surface of the second semiconductor chip, the second semiconductor chip configured from a gallium nitride semiconductor material, the source bond pad of the second semiconductor chip electrically coupled to the drain bond pad of the first semiconductor chip, the gate bond pad of the second semiconductor chip electrically coupled to the source bond pad of the first semiconductor chip, and the drain bond pad of the second semiconductor chip electrically coupled to the second device receiving structure;
electrically coupling the gate bond pad of the first semiconductor device to the first lead; and
electrically coupling the source bond pad of the first semiconductor chip to the second lead.

19. The method of claim 18, wherein coupling the second semiconductor chip to the second device receiving area includes flip chip bonding the second semiconductor chip to the second device receiving area.

20. The method of claim 19, wherein coupling the second semiconductor chip to the second device receiving area includes coupling a first portion of the second semiconductor chip to the first semiconductor chip and coupling a second portion of the second semiconductor chip to the second device receiving area.

* * * * *